United States Patent [19]
Tsubone et al.

[11] Patent Number: 5,100,815
[45] Date of Patent: Mar. 31, 1992

[54] FABRICATION METHOD FOR BIMOS SEMICONDUCTOR DEVICES WITH IMPROVED SPEED AND RELIABILITY

[75] Inventors: Ko Tsubone; Yoshio Umemura; Kouichi Shimoda, all of Tokyo, Japan

[73] Assignee: Oki Electric Industry Co., Ltd., Tokyo, Japan

[21] Appl. No.: 634,508

[22] Filed: Dec. 27, 1990

[30] Foreign Application Priority Data

Dec. 27, 1989 [JP] Japan ................. 1-336387

[51] Int. Cl.$^5$ ........................................ H01L 21/265
[52] U.S. Cl. ............................ 437/34; 437/56; 437/31; 437/913; 148/DIG. 9
[58] Field of Search .............. 437/34, 56, 57, 31, 437/33, 913; 148/DIG. 9

[56] References Cited

U.S. PATENT DOCUMENTS

| | | | |
|---|---|---|---|
| 4,727,038 | 2/1988 | Watabe et al. | 437/56 |
| 4,731,341 | 3/1988 | Kawakatsu | 437/33 |
| 4,873,200 | 10/1989 | Kawakatsu | 437/31 |
| 4,891,328 | 1/1990 | Gris | 437/57 |
| 4,957,874 | 9/1990 | Soejima | 437/57 |
| 4,975,381 | 12/1990 | Taka et al. | 437/33 |

FOREIGN PATENT DOCUMENTS 0281456 11/1988 Japan ................. 437/56

OTHER PUBLICATIONS

"High Performance LSI Process Technology: SST CBi-CMOS," Kobayashi et al., *Extended Abstracts of IEDM '88*, pp. 760–763.

*Primary Examiner*—Brian E. Hearn
*Assistant Examiner*—Michael Trinh
*Attorney, Agent, or Firm*—Spencer & Frank

[57] ABSTRACT

To create bipolar and MOS transistors, a substrate is covered with polysilicon. The polysilicon is patterned to form gate electrodes in MOS transistor regions, and to form polysilicon patterns surrounding central openings in bipolar transistor base-and-emitter regions. Lightly-doped source and drain layers are created by implanting impurities into the MOS transistor regions, using the gate electrodes as masks. Active bases are formed in the base-and-emitter regions below the central openings. Then sidewalls are added to the polysilicon, narrowing the central openings and widening the gate electrodes. Impurities are implanted into the MOS transistor regions, using the widened gate electrodes as masks, to create heavily-doped source and drain layers. The active base areas are doped below the narrowed central openings to create emitters.

8 Claims, 23 Drawing Sheets

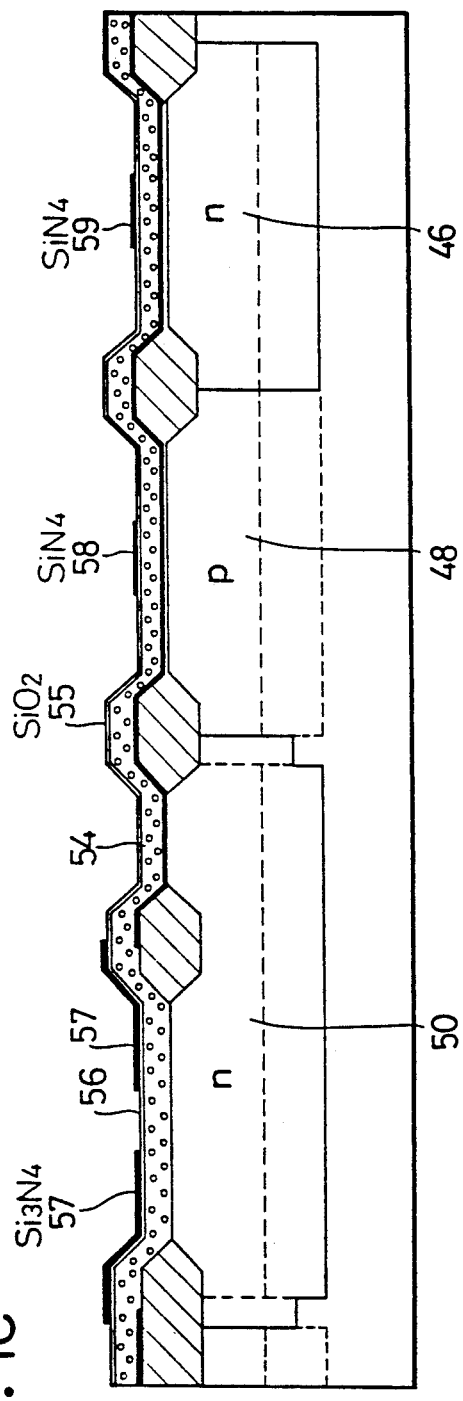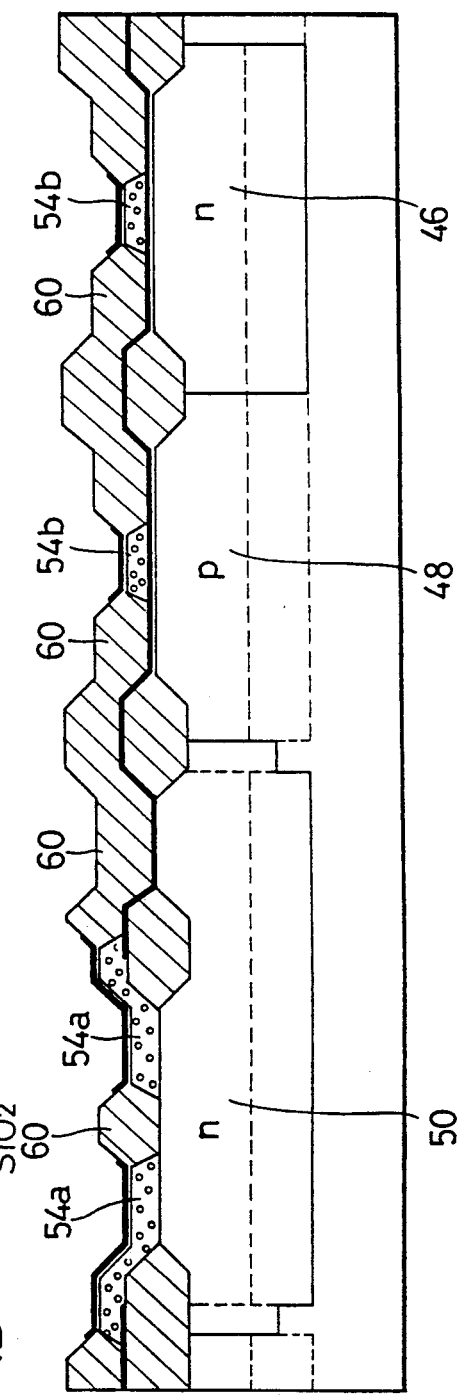

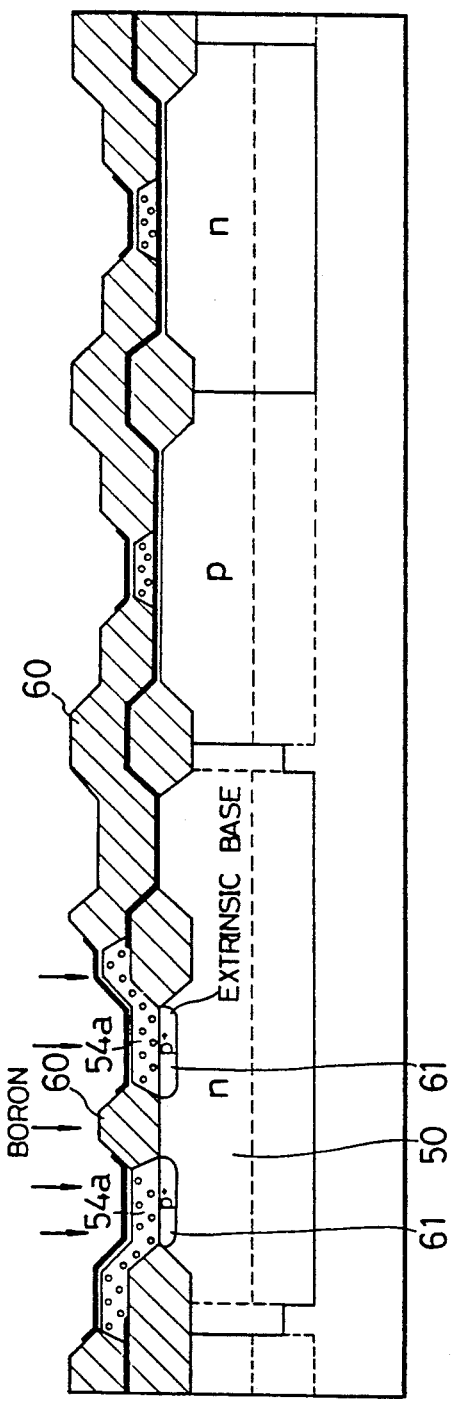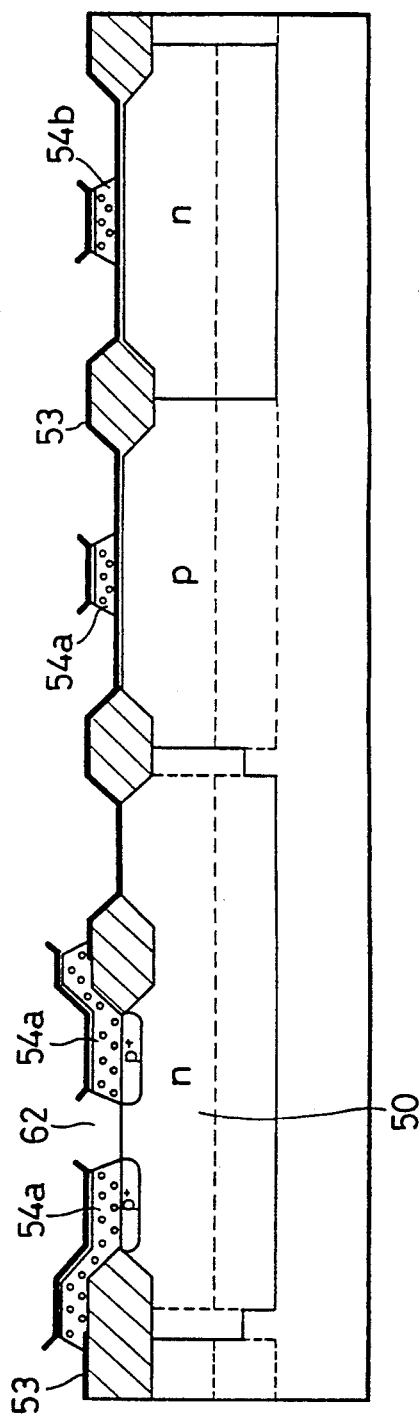

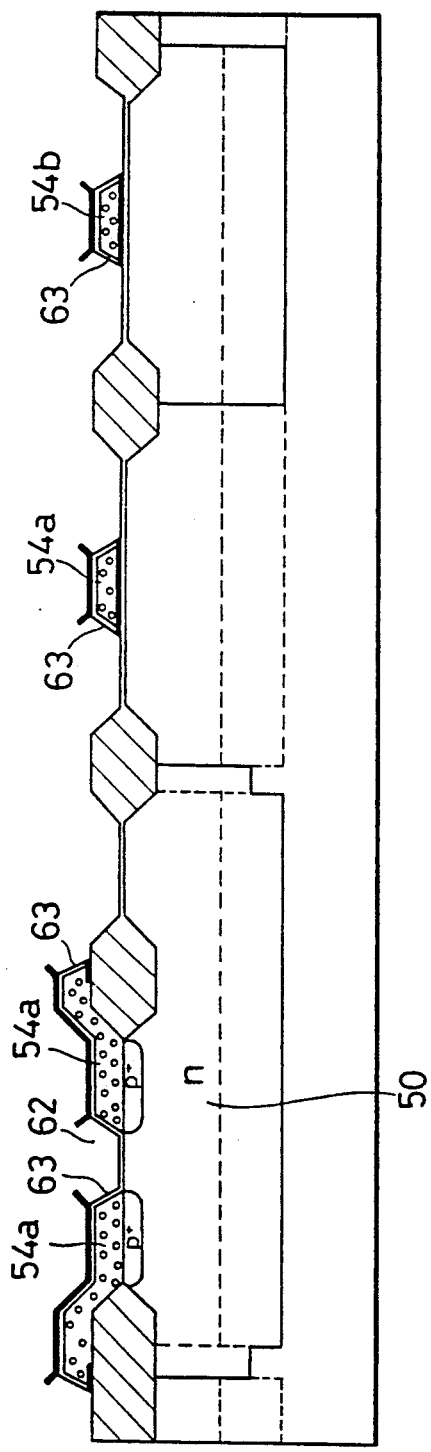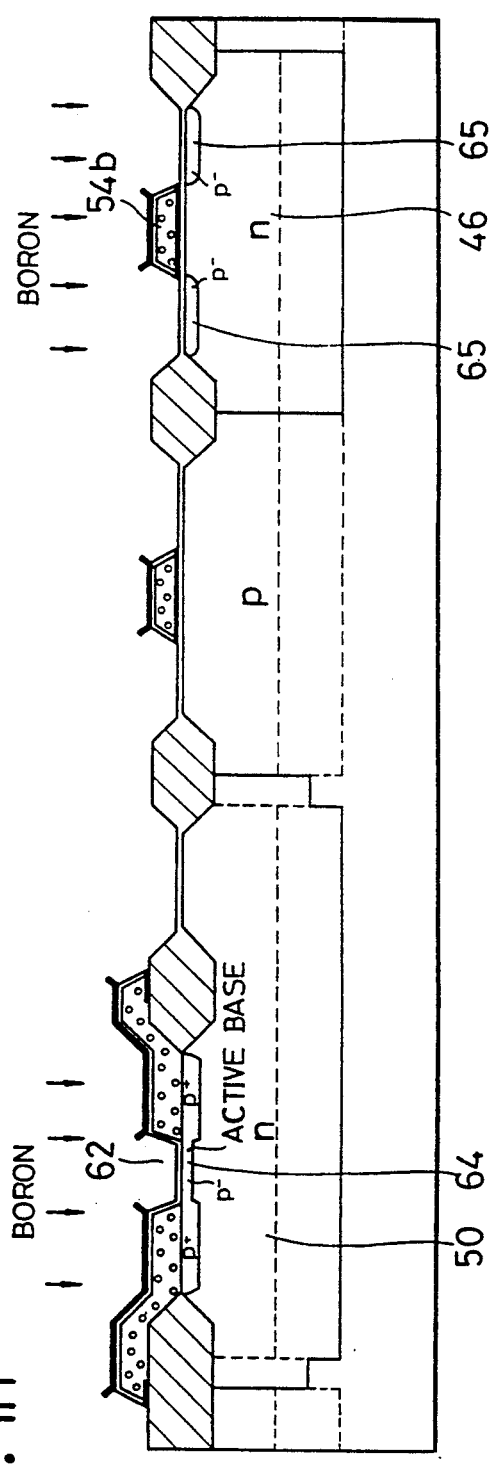

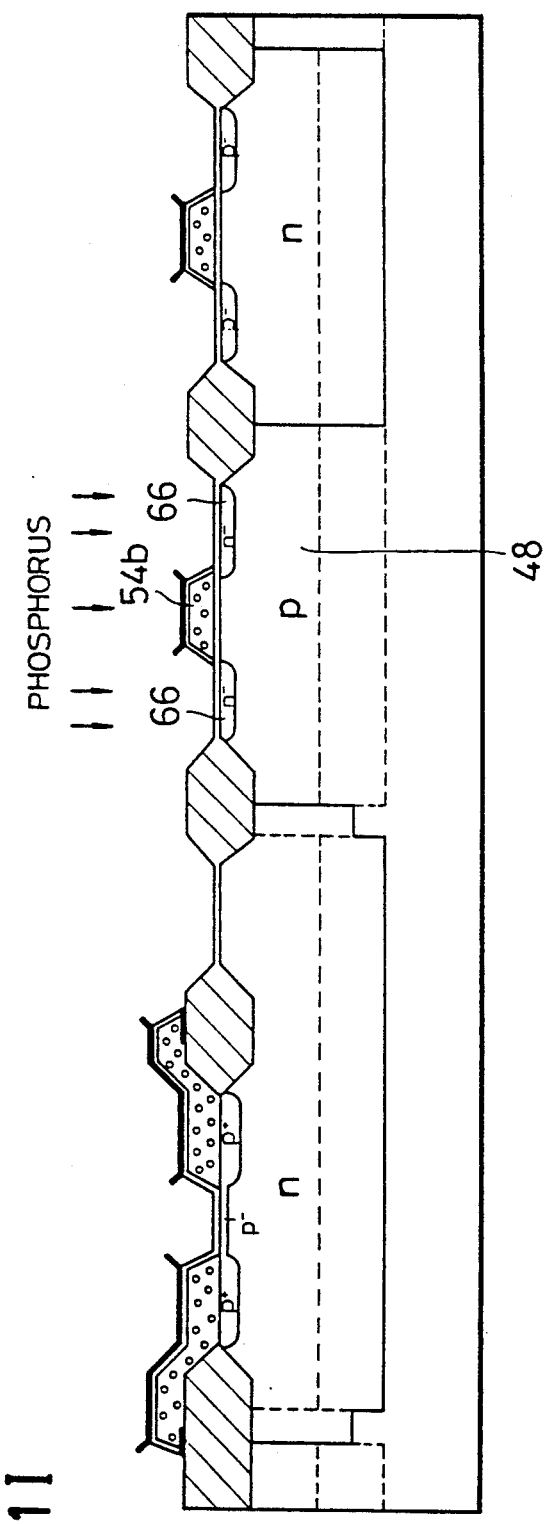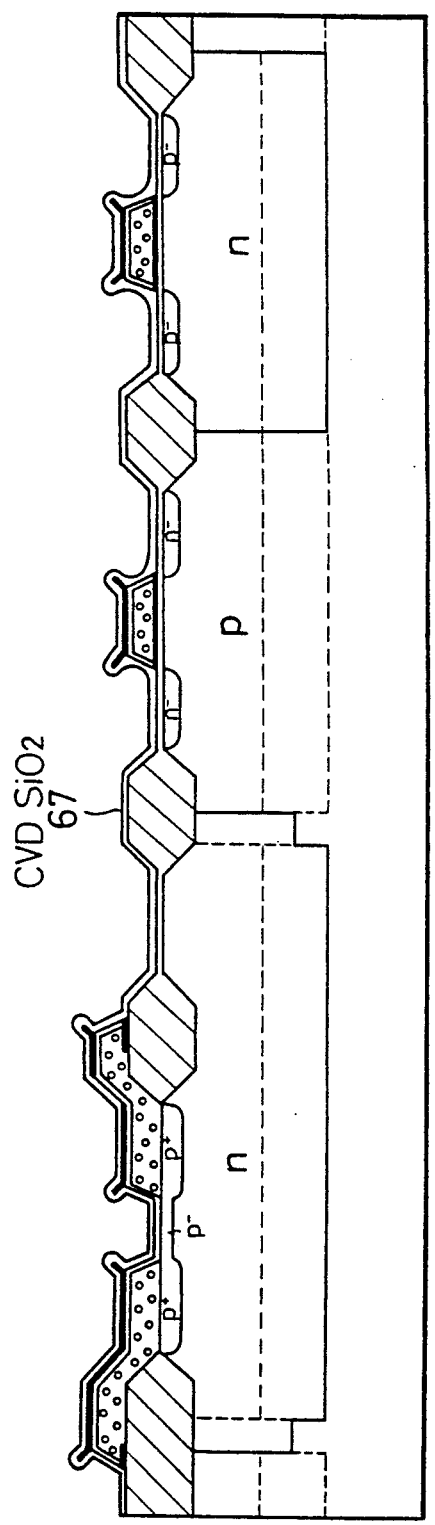
FIG. 1I
FIG. 1J

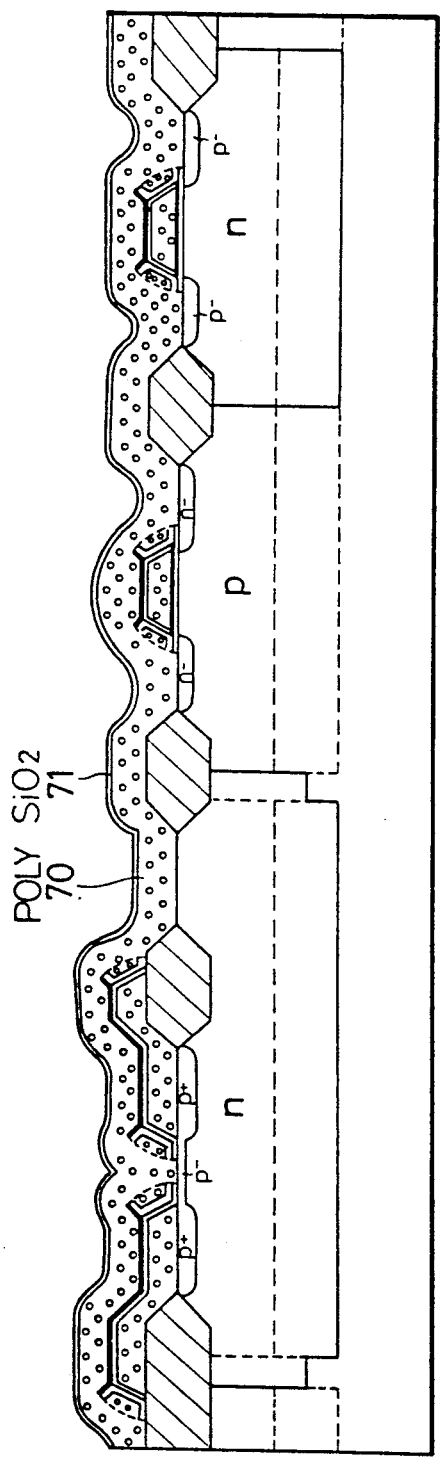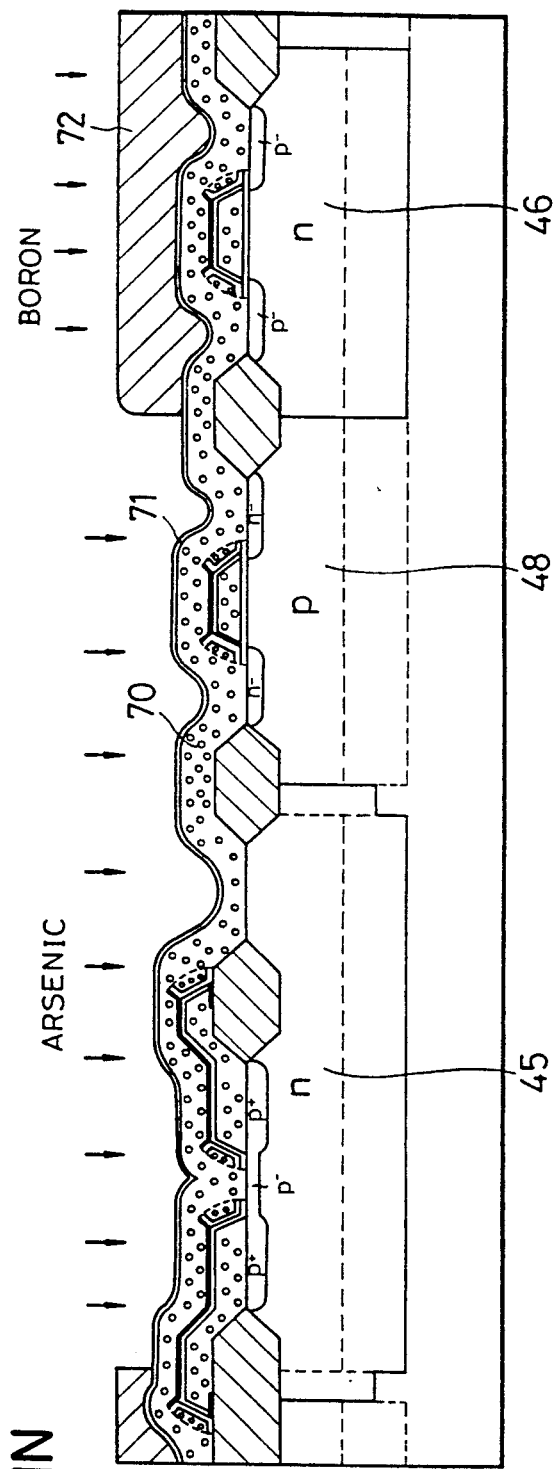
FIG. 1M
FIG. 1N

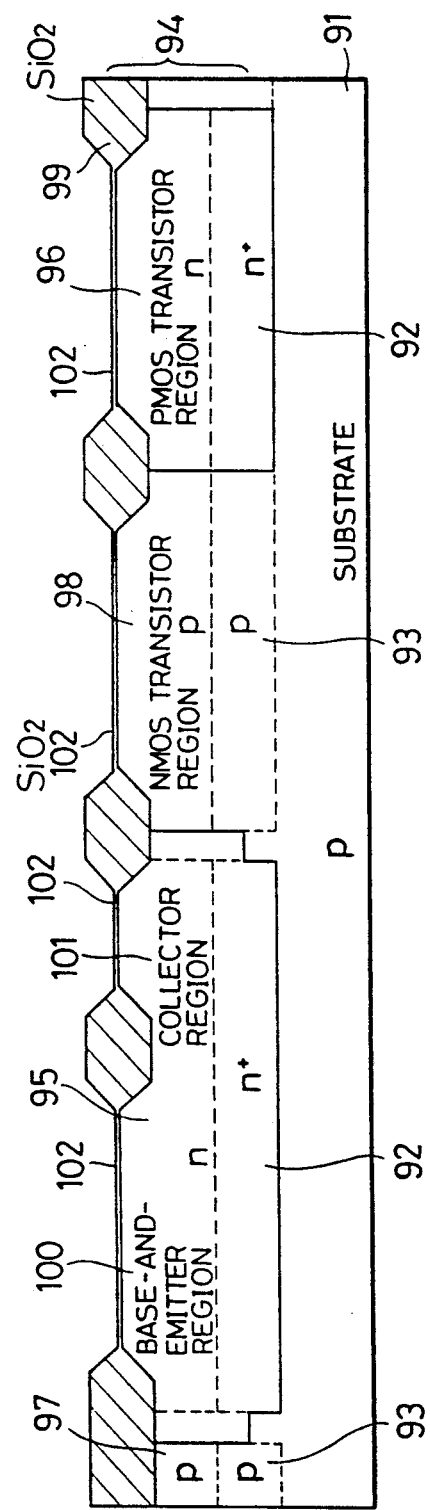
F I G. 2A
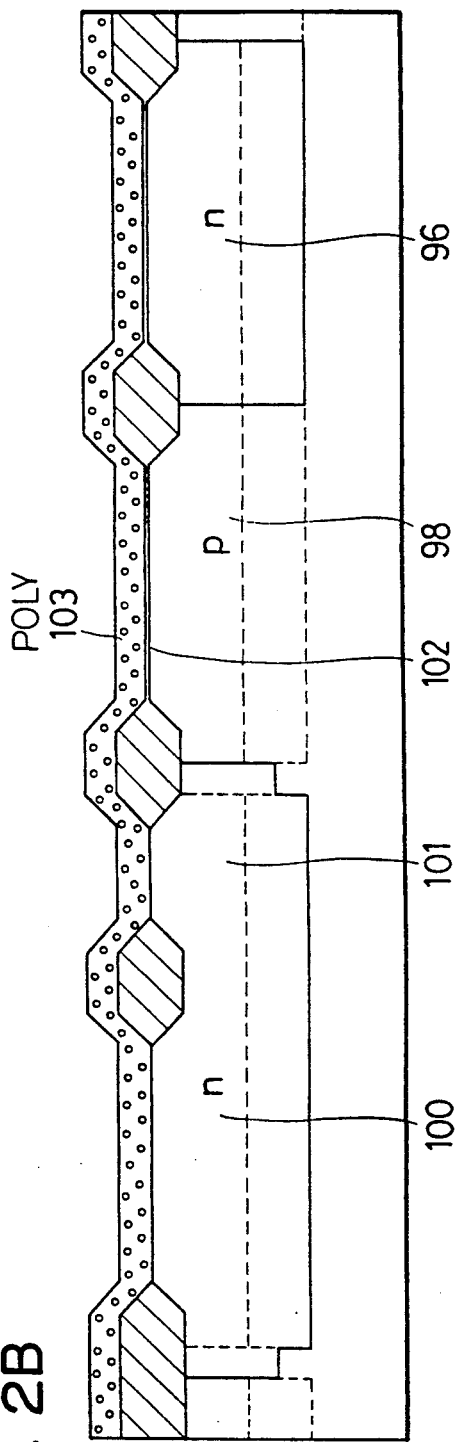
F I G. 2B

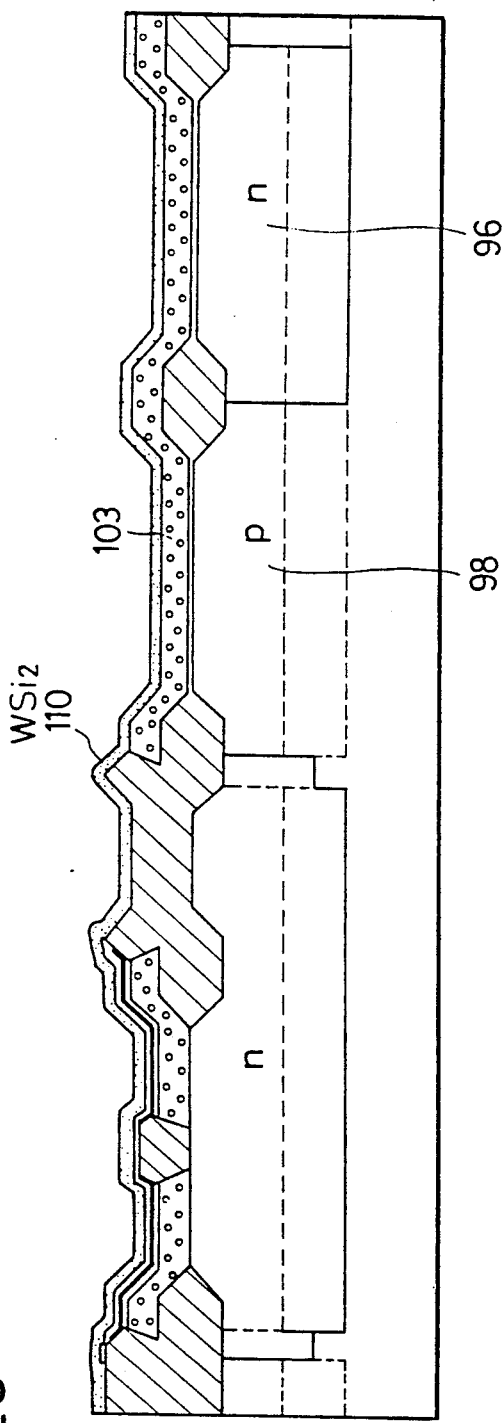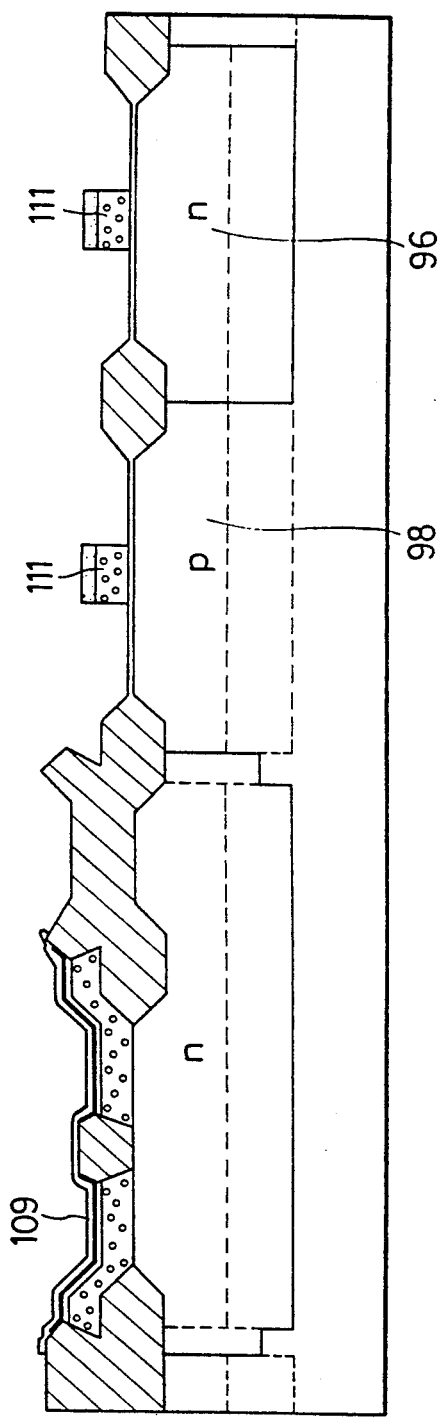
FIG. 2G
FIG. 2H

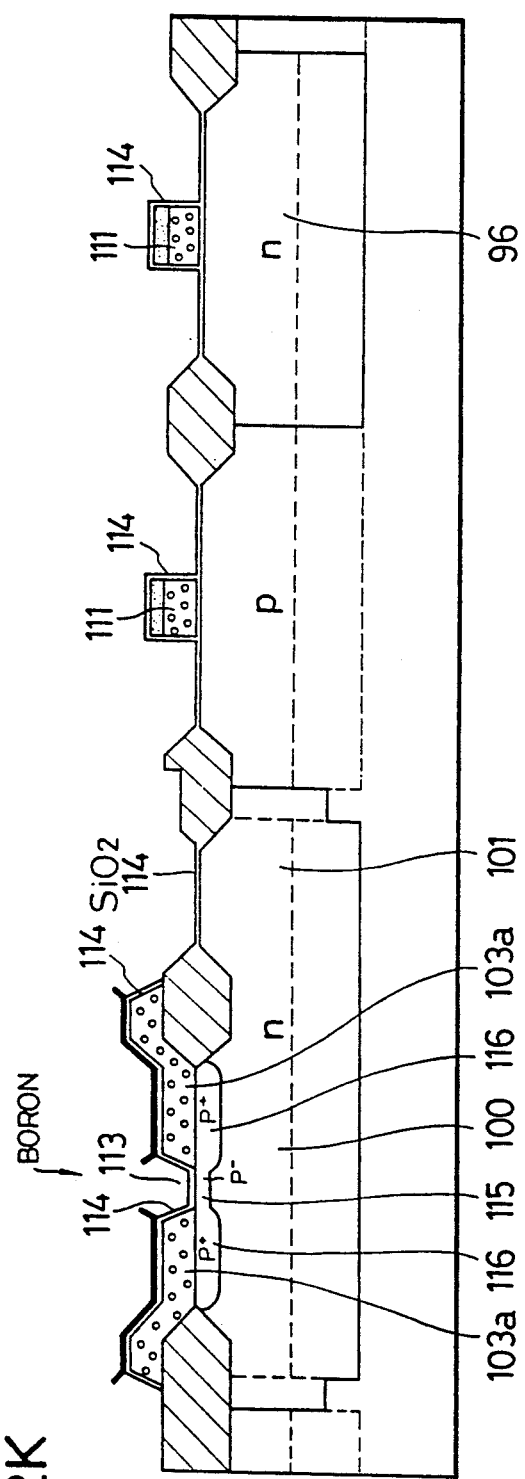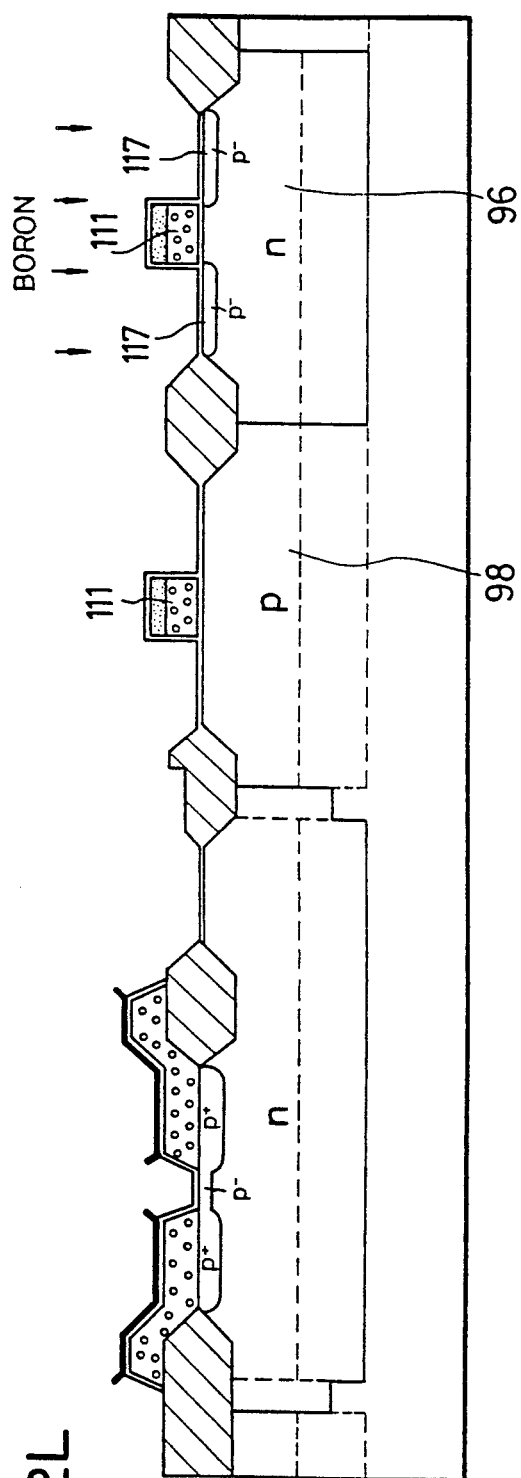

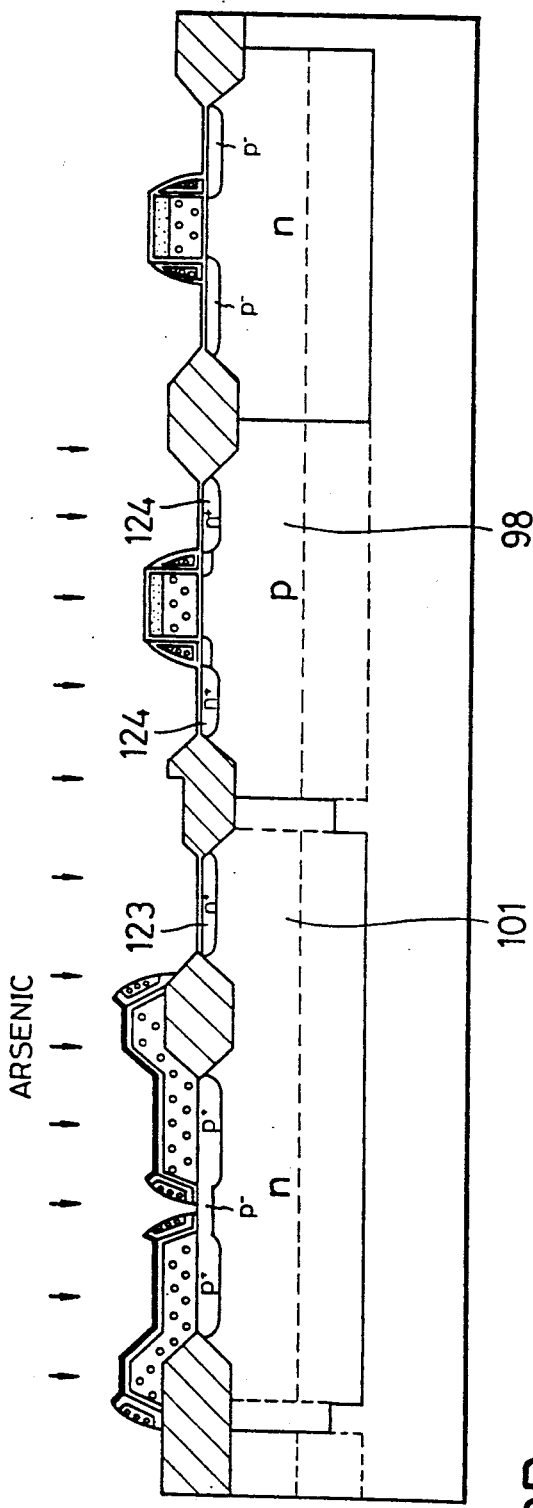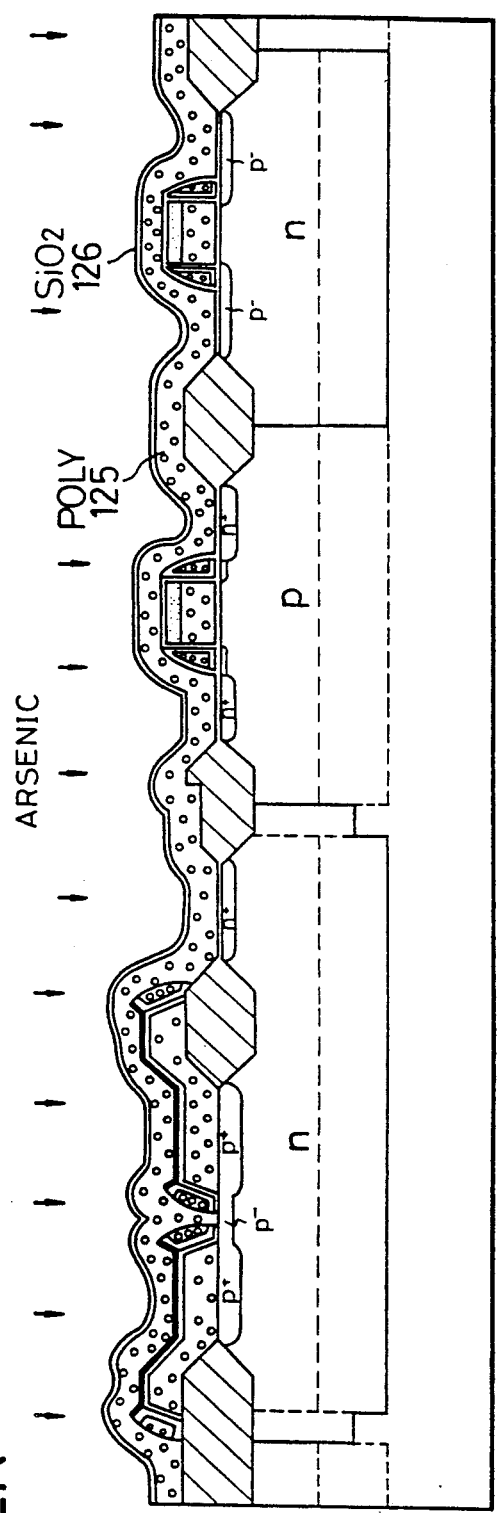

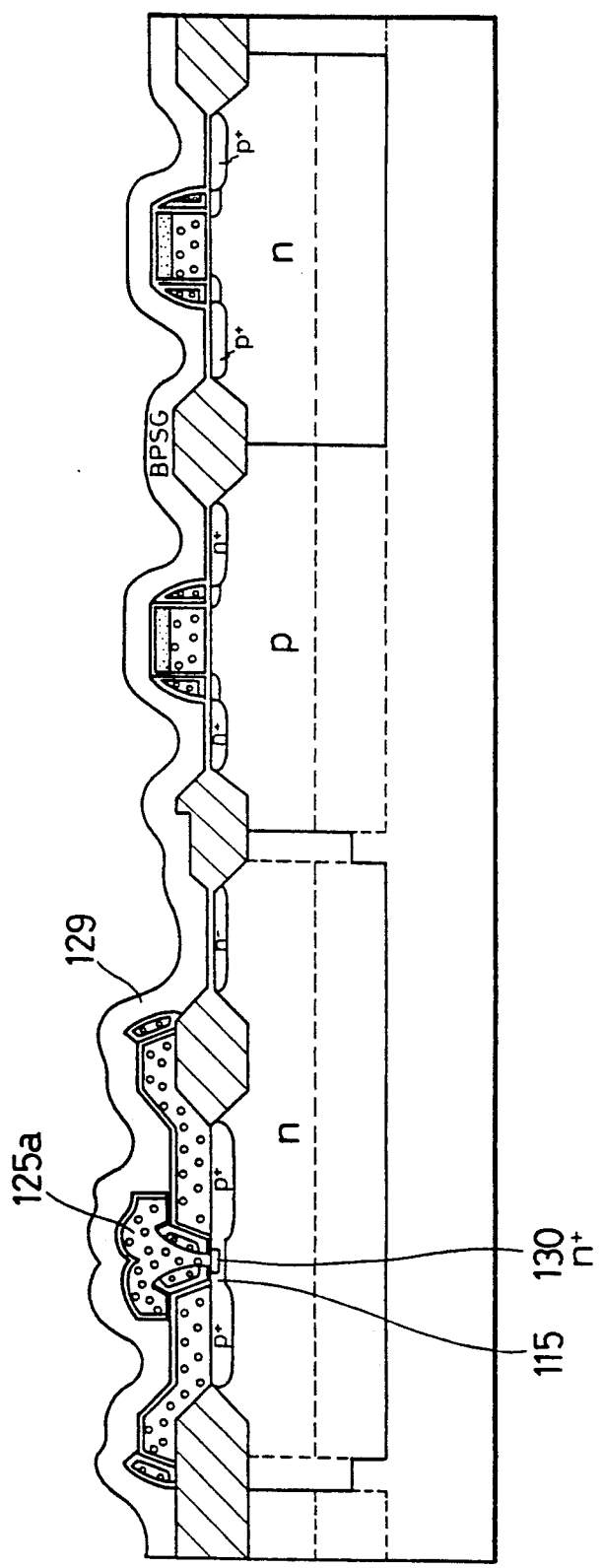

FABRICATION METHOD FOR BIMOS SEMICONDUCTOR DEVICES WITH IMPROVED SPEED AND RELIABILITY

BACKGROUND OF THE INVENTION

This invention relates to a method of fabricating high-speed bipolar transistors and highly reliable MOS field-effect transistors on the same semiconductor substrate.

Semiconductor devices fabricated in this way are generally referred to as biMOS devices. When MOS transistors of both the p-channel type (PMOS transistors) and n-channel type (NMOS transistors) are formed, the device is referred to as a biCMOS device. By combining the high-speed performance of bipolar transistors with the low power dissipation and high integration density of CMOS technology, biCMOS devices offer significant advantages in semiconductor applications such as interface logic, static random-access memory, mixed analog/digital circuits, and gate arrays.

The speed and integration level of a biMOS device can be increased by reducing the widths of the emitters of the bipolar transistors and lengths of the channels in the MOS transistors. The channel length of a MOS transistor is substantially equal to the length of its gate electrode. The attainable emitter width and gate length are determined by the smallest dimension that can be consistently resolved on the semiconductor fabrication line, which dimension is generally referred to as the design rule. Design rules in the neighborhood of one micrometer are typical at present.

The speed of a bipolar transistor is commonly measured by its cut-off frequency $f_T$. To maximize $f_T$ it is desirable to make the emitter width equal to the design rule, or even smaller. To maximize the integration level of MOS transistors, it is similarly desirable to make the gate length equal to the design rule, but in the prior art this has proven difficult to do without adverse effects on reliability.

The problem is that as the gate length is reduced, the strength of the electric field $\epsilon$ in the channel tends to increase. For the standard 5-V power supply voltage, when the channel is shorter than about 1.5 μm, the electric field becomes strong enough to inject so-called hot carriers into the substrate below and the gate oxide above the channel. Carriers injected into the substrate create an unwanted substrate current. Carriers injected into the gate oxide may become trapped and degrade the characteristics of the transistor. More specifically, carriers trapped in the gate oxide generate a surface potential that degrades such characteristics as the threshold voltage $V_T$ and transconductance $g_m$, and causes increased leakage in the subthreshold region.

Another problem faced by manufacturers of biMOS semiconductor devices is the inherent complexity of the fabrication process, which raises the cost of the devices. To reduce the complexity, it is desirable to combine bipolar transistor fabrication steps with MOS transistor fabrication steps as far as possible.

SUMMARY OF THE INVENTION

It is accordingly an object of the present invention to fabricate bipolar transistors with a high $f_T$ value.

Another object of the invention is to fabricate highly reliable MOS transistors with a short gate length.

A further object of the invention is to combine fabrication steps for improving the speed of bipolar transistors with fabrication steps for improving the reliability of MOS transistors.

The invented fabrication method begins with the creation of suitably doped bipolar transistor regions and MOS transistor regions in a semiconductor substrate. The bipolar transistor regions are further subdivided into base-and-emitter regions and collector regions.

Polysilicon gate electrodes are formed in the MOS transistor regions. Each base-and-emitter region is covered with polysilicon except for a central opening. The MOS transistor region are lightly doped, using the gate electrodes as masks, to create lightly-doped source and drain layers. The base-and-emitter regions are doped to form an active base under each central opening, and an extrinsic base under the portion covered by polysilicon.

Then sidewalls are formed on the polysilicon, thereby narrowing the central openings in the base-and-emitter regions and widening the gate electrodes in the MOS transistor regions. The MOS transistor regions are heavily doped, using the widened gate electrodes as masks, to create heavily-doped source and drain layers. Active base areas disposed below the narrowed central openings in the base-and-emitter regions are doped to create emitters.

DETAILED DESCRIPTION OF THE INVENTION

Two novel fabrication methods embodying the present invention will be described below with reference to the drawings. Both methods fabricate biCMOS devices. The drawings illustrate the fabrication of a representative part of a biCMOS device, comprising one bipolar transistor, one NMOS transistor, and one PMOS transistor. It should be understood that these form only one portion of a semiconductor wafer on which a large number of bipolar, NMOS, and PMOS transistors are fabricated simultaneously.

These two methods are shown to illustrate the invention, not to restrict its scope, which is set forth in the appended claims. It will be obvious that these methods are capable of modification without departing from the spirit of the invention. For example, biMOS devices having only bipolar and PMOS (or NMOS) transistors can be fabricated, omitting those steps which serve solely for the of NMOS (or PMOS) transistors.

Where specific dimensions are mentioned, a design rule of 1 μm will be assumed. The invention is not restricted to this design rule, however; it is applicable to other design rules as well.

Figure 1A:
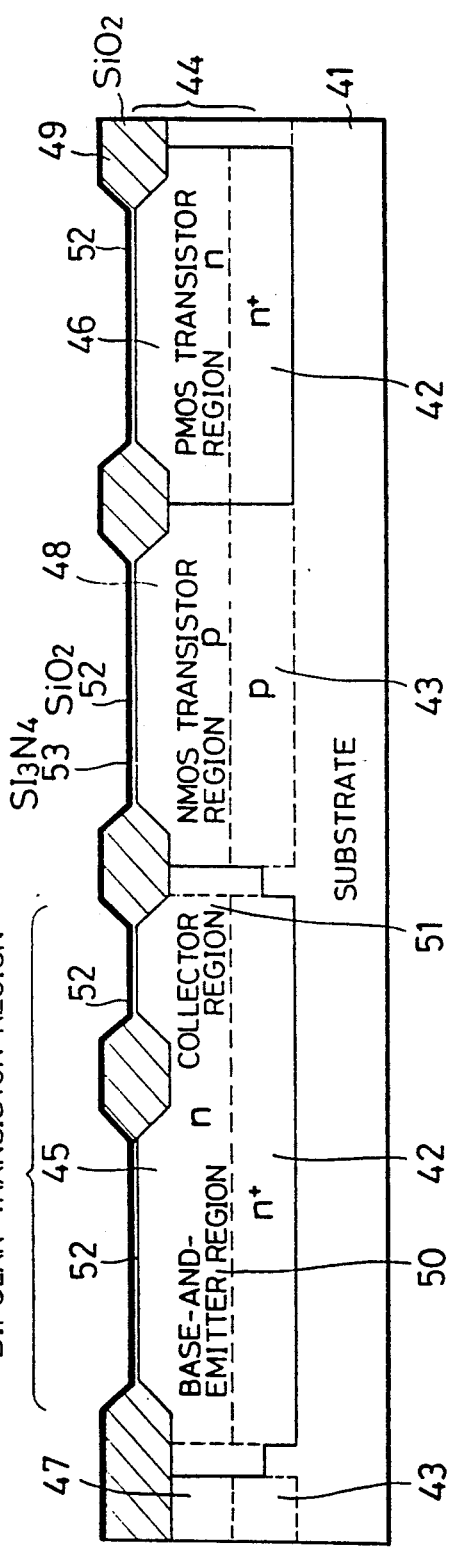
FIGS. 1A to 1R are sectional views illustrating steps in a first novel biMOS fabrication process.

With reference to FIG. 1A, the first novel fabrication method starts from a p-type (100) monocrystalline silicon wafer substrate 41 having a specific resistance in the range of 10 to 20Ω·cm. An n-type layer 42 with a sheet resistance of substantially 40Ω/square and junction depth of substantially 2.0 μm is created by implanting antimony ions at a dose of $1.5 \times 10^{15}$ cm$^{-2}$ and accelerating voltage of 40 keV, then heating the wafer to 1150° C. to drive the antimony in. A p-type buried layer 43 is then formed by selectively implanting boron ions with a dose of $5 \times 10^{12}$ cm$^{-2}$ and accelerating voltage of 120 keV and driving the boron in. After formation of the buried layers 42 and 43, an n-type epitaxial layer 44 with a specific resistance of substantially 1.5Ω·cm and thickness of substantially 1.4 μm is deposited on the substrate 41.

Phosphorus ions are selectively implanted into the epitaxial layer 44 above the n-type buried layer 42 at a dose of $2 \times 10^{12}$ cm$^{-2}$ and accelerating voltage of 170 keV and driven in at 1000° C. for 20 minutes to simultaneously create bipolar transistor regions 45 and PMOS transistor regions 46. These regions 45 and 46 are n$^-$ regions having a surface concentration of $5 \times 10^{16}$ cm$^{-2}$ and diffusion depth of 1.5 μm.

Next boron ions are implanted into the epitaxial layer 44 above the p-type buried layer 43 at a dose of $4.5 \times 10^{12}$ cm$^{-2}$ and accelerating voltage of 100 keV and driven in at 1000° C. for 20 minutes to simultaneously create p-type isolation regions 47 for the bipolar transistors, and NMOS transistor regions 48. The regions 47 and 48 are p-type regions having a surface concentration of $5 \times 10^{16}$ cm$^{-2}$ and diffusion depth of 1.5 μm.

The transistor regions 45, 46, and 48 are now isolated from each other and from peripheral regions by selectively forming field oxides 49 on the surface of the epitaxial layer 44, using the well-known localized oxidation of silicon (LOCOS) method. Field oxides 49 are moreover formed within the bipolar transistor regions 45, dividing each into a base-and-emitter region 50 and a collector region 51. An oxide layer 52 with a thickness of 150 angstroms is now grown on the surface of the transistor regions 46, 48, 50, and 51 by thermal oxidation in a dry O$_2$ atmosphere at 900° C. for 30 minutes. Then a thin nitride (Si$_3$N$_4$) layer 53, having a thickness of substantially 100 angstroms, is formed on the entire surface by the well-known low-pressure chemical vapor deposition (LPCVD) method.

Figure 1B:
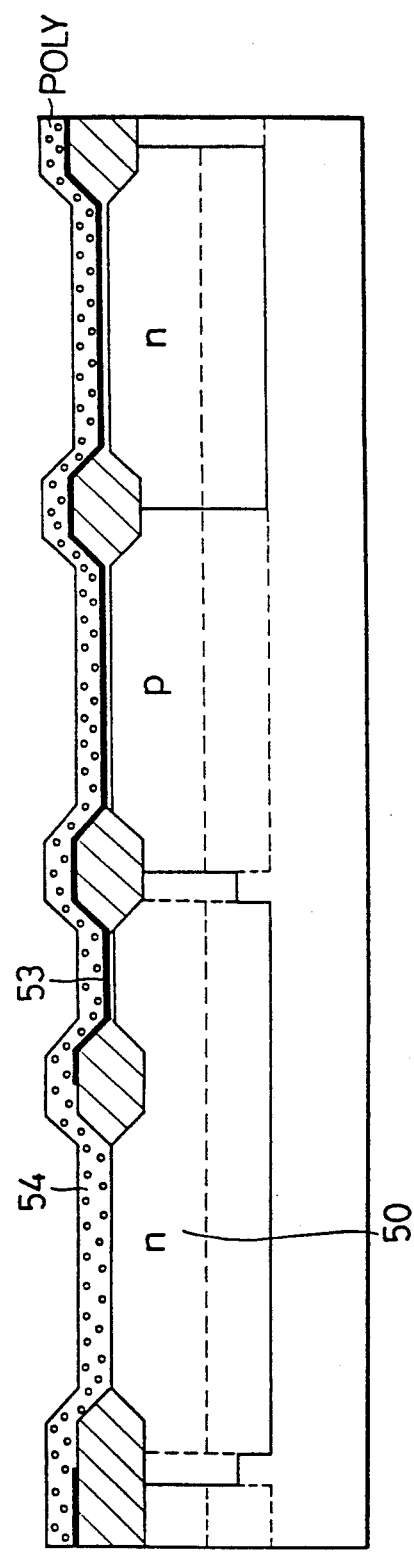

Next, with reference to FIG. 1B, the nitride layer 53 and the oxide layer 52 are removed from the bipolar transistor base-and-emitter regions 50 by well-known photolithographic etching techniques. Then a non-doped polysilicon layer 54 is grown to a thickness of 3000 angstroms overall by the LPCVD method.

Next, with reference to FIG. 1C, the surface of the polysilicon layer 54 is oxidized at 900° C. in a dry oxygen atmosphere for 30 minutes to create an oxide layer 55 with a thickness of 200 angstroms. A thick nitride layer, having a thickness of substantially 1500 angstroms, is grown on the oxide layer 55 by the LPCVD method and patterned as follows. The nitride layer is removed to create central openings 56 centered over the bipolar transistor base-and-emitter regions 50, the remaining parts of which are left covered by nitride layers 57. The nitride layer is entirely removed from the bipolar transistor collector regions 51. In the MOS transistor regions 48 and 46, nitride layers 58 and 59 are left over centrally located gate regions. The nitride is removed from all other regions. The central openings 56 and the nitride layers 58 and 59 should preferably have the design-rule dimension.

Next, with reference to FIG. 1D, the wafer is oxidized in a wet O$_2$ atmosphere under high pressure (substantially seven times standard atmospheric pressure) at a temperature of substantially 1030° C. Where not masked by the nitride layers 57, 58, and 59, the polysilicon layer 54 is thus converted to an oxide 60 substantially 8000 angstroms thick. In the bipolar transistor base-and-emitter regions 50, oxide 60 is created in the central area where the emitter will be formed, a polysilicon pattern 54a being left therearound. In the MOS transistor regions 48 and 46, polysilicon gate electrodes 54b are left, all the rest of the polysilicon being converted to oxide 60. The edges of the oxide 60 are tapered and extend under the edges of the nitride (the so-called bird's-beak effect), as can be seen in the drawing.

Next, with reference to FIG. 1E, boron ions are implanted through the polysilicon patterns 54a into each of the base-and-emitter regions 50 at a dose of $2 \times 10^{15}$ cm$^{-2}$ and accelerating voltage of 100 keV, forming an extrinsic base 61. This boron implant is restricted to the base-and-emitter regions 50 by means of a patterned resist, not shown in the drawing, which is removed after the implant.

Next, with reference to FIG. 1F, the oxide 60 is entirely removed by wet etching, creating central openings 62 defined by the polysilicon patterns 54a in the base-and-emitter regions 50, and exposing the thin nitride layer 53, except where it is covered by the gate electrodes 54b and the edges of the polysilicon patterns 54a.

Next, with reference to FIG. 1G, the exposed thin nitride layer 53 is removed with hot phosphoric acid, leaving a nitride covering only on the polysilicon patterns 54a and the polysilicon gate electrodes 54b. The nitride covering somewhat overhangs the edges of the polysilicon patterns 54a and the gate electrodes 54b. These edges are now oxidized by a wet oxidation process, performed at 800° C. for 15 minutes. An oxide layer 63 with a thickness of substantially 180 angstroms is thus formed on the lateral walls of the polysilicon gate electrodes 54b, on the outside edge surfaces of the polysilicon patterns 54a, and on the inner surfaces of the central openings 62, including both their lower surface, which is the monocrystalline silicon surface of the region 50, and their lateral walls, which are lateral surfaces of the polysilicon patterns 54a.

Next, with reference to FIG. 1H, boron ions are implanted at a dose of $1.5 \times 10^{13}$ cm$^{-2}$ and accelerating voltage of 40 keV into the bipolar transistor base-and-emitter regions 50 and the PMOS transistor regions 46. In the bipolar transistor base-and-emitter regions 50, the boron passes only through the central openings 62, creating an active base 64 below each. In the PMOS transistor regions 46, the boron ions are masked by the gate electrodes 54b and create p$^-$ lightly-doped source and drain layers 65 on either side of the gate electrodes 54b.

Next, with reference to FIG. 1I, phosphorus ions are selectively implanted at a dose of $1.5 \times 10^{13}$ cm$^{-2}$ and accelerating voltage of 33 keV into the NMOS transistor regions 48 to n$^-$ lightly-doped source and drain layers 66, the gate electrodes 54b acting as masks.

Next, with reference to FIG. 1J, a CVD SiO$_2$ layer 67 1000 angstroms thick is grown on the entire surface by the LPCVD method.

Figure 1K:
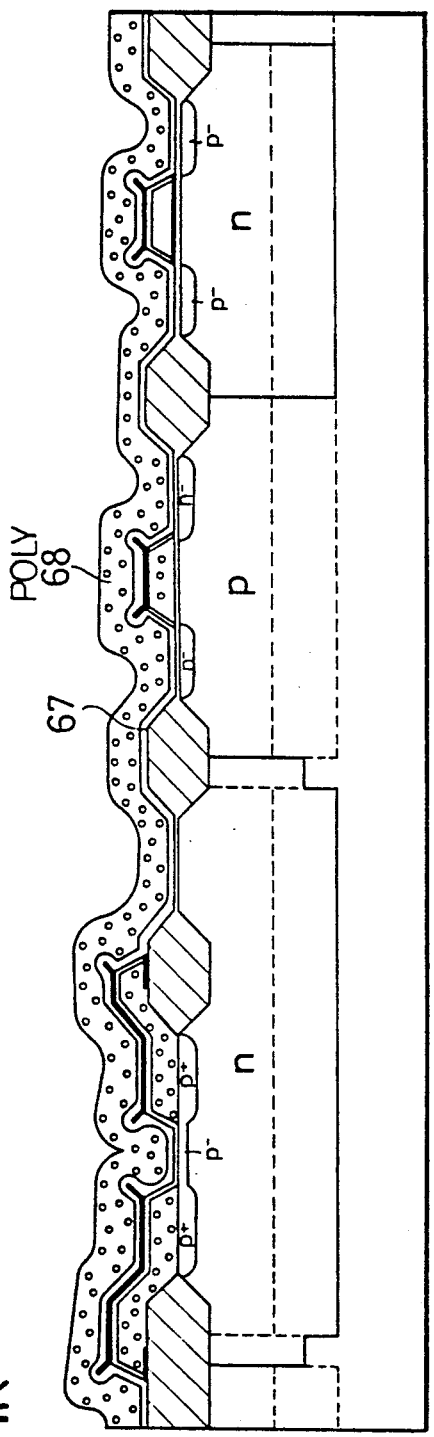

Next, with reference to FIG. 1K, a polysilicon layer 68 2000 angstroms thick is grown on the entire surface by the same LPCVD method.

Figure 1L:
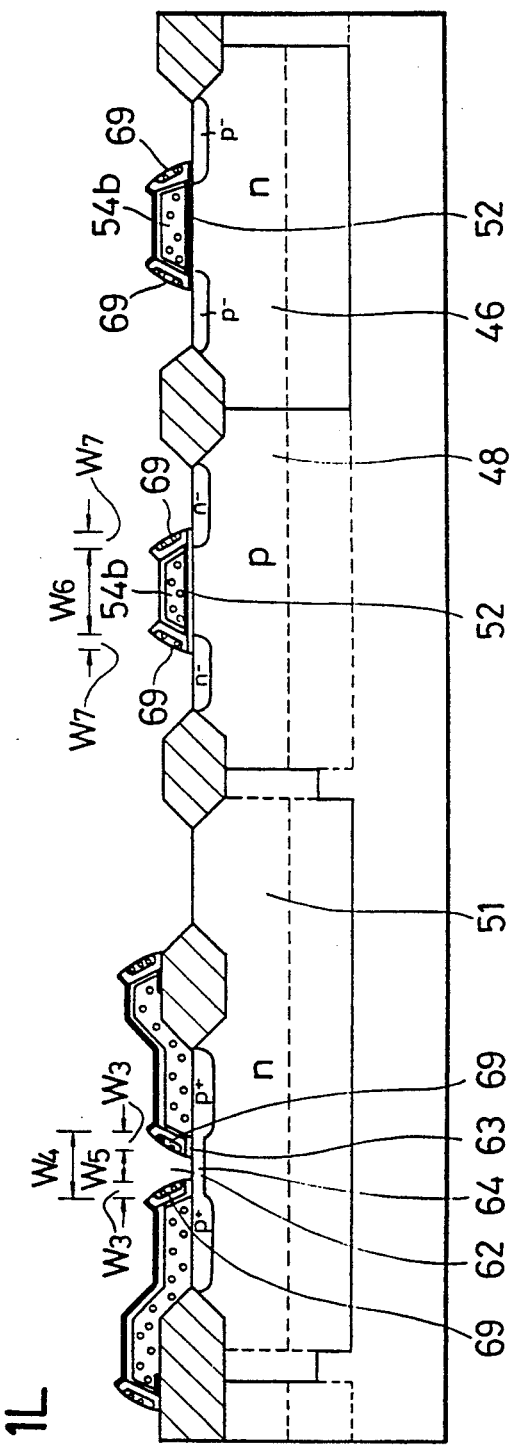

Next, with reference to FIG. 1L, the polysilicon layer 68 and the CVD SiO₂ layer 67 are etched by a continuous, anisotropic, reactive ion etching (RIE) process. All parts of the polysilicon layer 68 and the CVD SiO₂ layer 67 are thus removed except for sidewalls 69 left on the lateral surfaces: in particular, on the lateral walls of the central openings 62 and the lateral walls of the gate electrodes 54b. The widths $W_3$ and $W_7$ of the sidewalls is substantially 0.2 μm, although this value can be varied according to the gas flow, pressure, and other etching parameters.

The original width $W_4$ of the central openings 62 was the design-rule dimension of 1 μm, so the width $W_5$ of the openings left after addition of the 0.2-μm sidewalls 69 is:

$$W_5 = W_4 - 2 \times W_3$$
$$= 0.6 \, \mu m$$

In this way it is possible to obtain an emitter width smaller than the design rule of 1.0 μm.

The original width $W_6$ of the gate electrodes 54b of the NMOS and PMOS transistors was the design-rule dimension of 1.0 μm. Addition of the 0.2 μm sidewalls 69 establishes an offset zone with a width $W_7$ of 0.2 μm around the gate electrodes 54b.

The reactive ion etch also removes the oxide layer 63 on the lower surface of the central openings 62, except where it underlies the sidewalls 69, thus exposing the surface of the active base 64. The oxide layer 52 is also etched, except in the MOS transistor gate areas, exposing the surfaces of the bipolar transistor collector regions 51 and the source and drain surfaces in the MOS transistor regions 48 and 46.

Next, with reference to FIG. 1M, a polysilicon layer 70 is grown over the entire surface to a thickness of 3000 angstroms by LPCVD, and an oxide layer 71 with a thickness of substantially 160 angstroms is formed on the surface of the polysilicon layer 70 by wet oxidation at 800° C. for 15 minutes.

Next, with reference to FIG. 1N, a resist 72 is applied and patterned to create a mask over the PMOS transistor regions 46. Arsenic ions are then implanted at a dose of $1 \times 10^{16}$ cm⁻² and accelerating voltage of 40 keV into the polysilicon layer 70 overlying the bipolar transistor regions 45 and the NMOS transistor regions 48. Next the resist 72 is removed, a new resist mask (not shown in the drawing) is created over the bipolar transistor regions 45 and the NMOS transistor regions 48, and boron ions are implanted at a dose of $2.5 \times 10^{15}$ cm⁻² and accelerating voltage of 100 keV into the polysilicon layer 70 over the PMOS transistor regions 46.

Figure 1O:
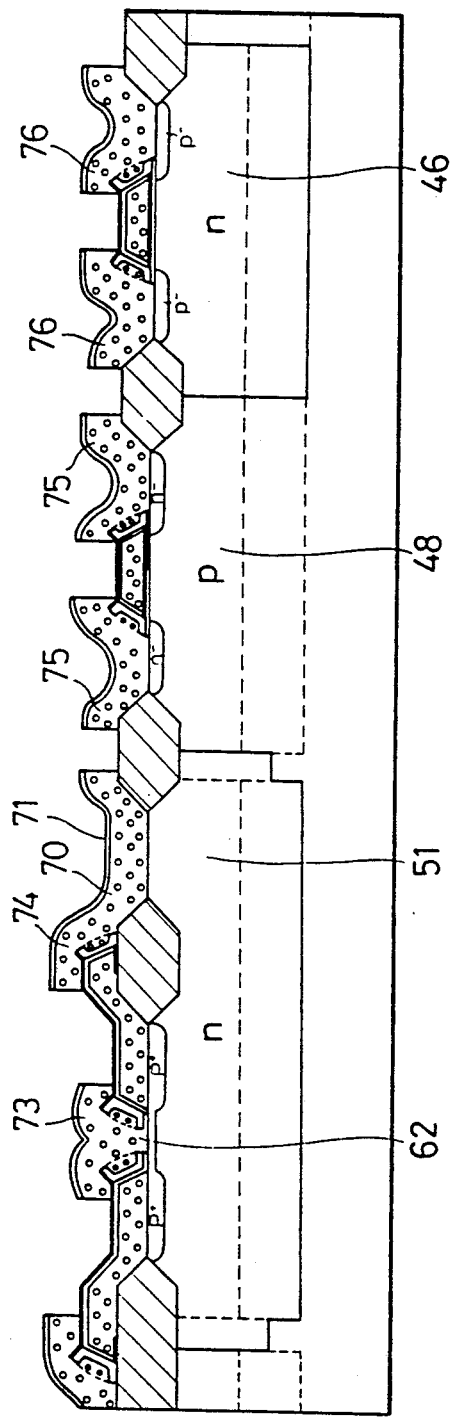

Next, with reference to FIG. 1O, the oxide layer 71 and polysilicon layer 70 are patterned by photolithographic etching techniques. The remaining part of the polysilicon layer 70 becomes emitter electrodes 73 filling the central openings 62, collector electrodes 74 in the collector regions 51, source and drain electrodes 75 in the NMOS transistor regions 48, and source and drain electrodes 76 in the PMOS transistor regions 46.

Figure 1P:
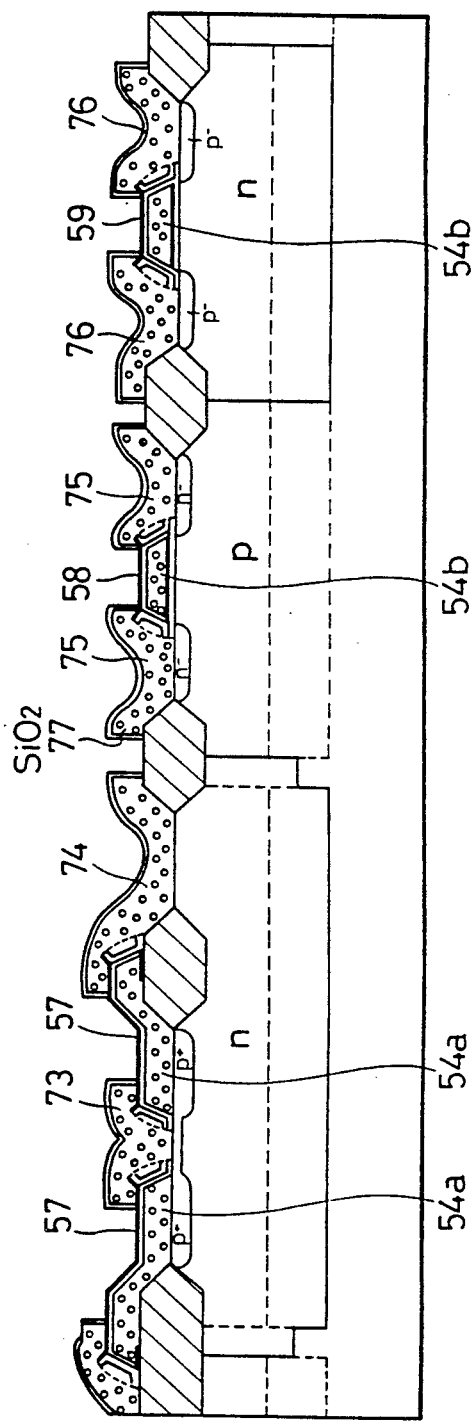

Next, with reference to FIG. 1P, wet oxidation is performed at 800° C. for 15 minutes to create an oxide layer 77 on the sides of the electrodes 73, 74, 75, and 76.

Figure 1Q:
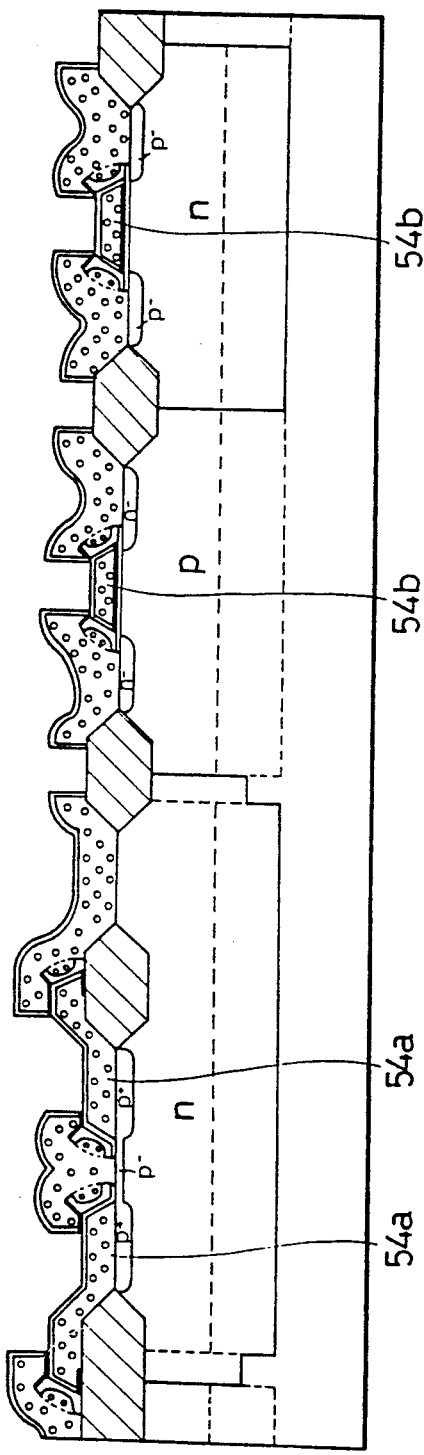

Next, with reference to FIG. 1Q, the nitride layers 57, 58, and 59 exposed on the polysilicon patterns 54a and the gate electrodes 54b are removed by wet etching with phosphoric acid.

Figure 1R:
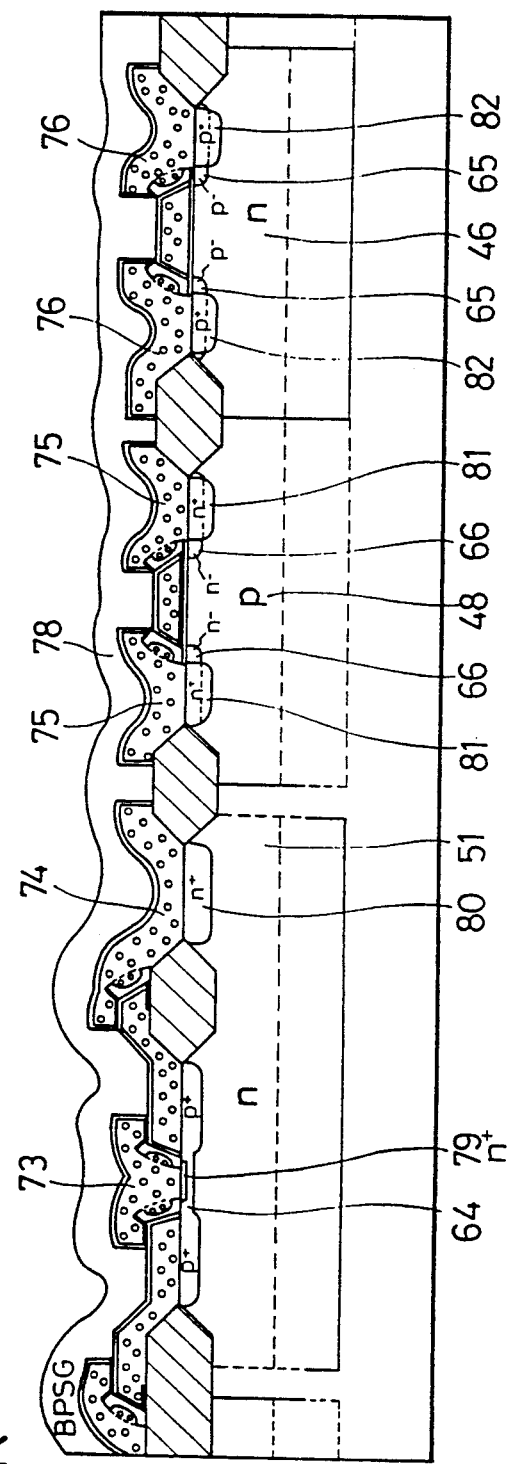

Next, with reference to FIG. 1R, a layer of borophosphosilicate glass (BPSG) 78 is grown over the entire surface to a thickness of 7000 angstroms by the CVD method, using 20 wt. % $P_2O_5$ and 8 wt. % $B_2O_3$, and the wafer is annealed at 920° C. for 30 minutes in a nitrogen atmosphere. Besides planarizing the surface of the BPSG 78, this annealing step causes arsenic to diffuse from the emitter electrodes 73, the collector electrodes 74, and the source and drain electrodes 75 to form emitters 79 in the active bases 64, collectors 80 in the collector regions 51, and $n^{30}$ heavily-doped source and drain layers 81 in the NMOS transistor regions 48. Similarly, boron diffuses from the source and drain electrodes 76 to form p⁺ heavily-doped source and drain layers 82 in the PMOS transistor regions 46.

Because the heavily-doped source and drain layers 81 and 82 are offset from the gate electrodes, the source and drain areas near the gate electrodes 54b comprise the lightly-doped layers 65 and 66. This combination of heavily-doped and lightly-doped source and drain layers is known as the lightly-doped drain (LDD) structure. Both the source and drain of each MOS transistor have an LDD structure.

Finally, the wafer is metalized to interconnect the electrodes and form the desired circuits. The metalization process, which is well known and accordingly not illustrated in the drawings, comprises steps of opening contact holes over the electrodes, then depositing and patterning one or more layers of a metal such as aluminum.

Next, a second novel fabrication method will be described with reference to FIGS. 2A to 2W. The second novel fabrication method differs from the first in that a layer of tungsten silicide is formed on the gate electrodes of the MOS transistors to reduce their resistance. Another difference is that polysilicon electrodes are formed only in the gate and emitter regions. The sources and drains of the MOS transistors and the collectors of the bipolar transistors are accordingly created by direct ion implantation rather than by diffusion of implanted ions from overlying polysilicon.

With reference to FIG. 2A, the second novel fabrication method starts from a p-type (100) monocrystalline silicon wafer substrate 91 having a specific resistance in the range of 10 to 20 Ω·cm. An n⁺ buried layer 92 with a sheet resistance of 40 Ω /square and diffusion depth of 2.5 μm is created by implanting antimony ions at a dose of $1.5 \times 10^{15}$ cm⁻² and accelerating voltage of 40 keV and driving them in at 1150° C. for substantially 480 minutes. Then a p-type buried layer 93 with a sheet resistance of 4k Ω/square and diffusion depth of 1 μm is formed by selectively implanting boron ions at a dose of $5 \times 10^{12}$ cm⁻² and accelerating voltage of 120 keV into the same substrate 91 and driving them in at 1000° C. for substantially 60 minutes. Next, an n-type epitaxial layer 94 with a specific resistance of 4Ω·cm and thickness of 1.4 μm is formed on the substrate 91 by the CVD method.

Next bipolar transistor regions 95, PMOS transistor regions 96, bipolar transistor isolation regions 97, and NMOS transistor regions 98 are created by implantation of phosphorus ions and boron ions, using the same process as described in FIG. 1A. The n-layers in the regions 95 and 96 have a sheet resistance of 6k Ω/square, while p-layers in the regions 97 and 98 a sheet resistance of 150 Ω/square. All regions 95, 96, 97, and 98 have a diffusion depth of substantially 1.5 μm.

Next field oxides 99 are created by the LOCOS method to isolate the transistor regions 95, 96, and 98 from each other and from peripheral areas, and to divide the bipolar transistor regions 95 into base-and-emitter regions 100 and collector regions 101. Then an oxide layer 102 with a thickness of 200 angstroms is formed on the surface of the transistor regions (the regions 96, 98, 100, and 101) by oxidation at 950° C. for substantially 30 minutes.

Next, with reference to FIG. 2B, the oxide layer 102 is removed from the bipolar transistor base-and-emitter regions 100 and the collector regions 101 by photolithographic etching techniques, leaving the oxide layer 102 present only on the surface of the MOS transistor regions 96 and 98. Then a non-doped polysilicon layer 103 is grown to a thickness of 3000 angstroms on the entire surface by the LPCVD method.

Figure 2C:
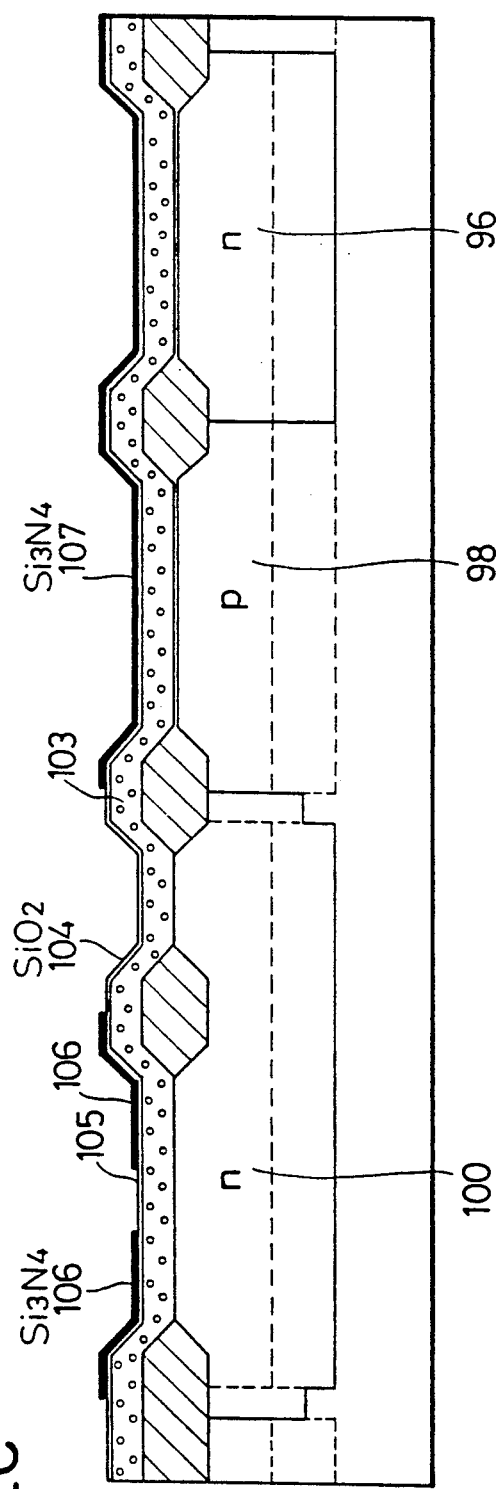
FIGS. 2A to 2W are sectional views illustrating steps in a second novel biMOS fabrication process.

Next, with reference to FIG. 2C, the surface of the polysilicon layer 103 is oxidized to create an oxide layer 104, over which a nitride layer 1500 angstroms thick is grown. The nitride is patterned to create central openings 105 surrounded by nitride layers 106 in the bipolar transistor base-and-emitter regions 100, and leave nitride layers 107 in the MOS transistor regions 96 and 98. This step is similar to the step in FIG. 1D in the first novel fabrication method except that the nitride layers 107 entirely cover the MOS transistor regions 96 and 98.

Figure 2D:
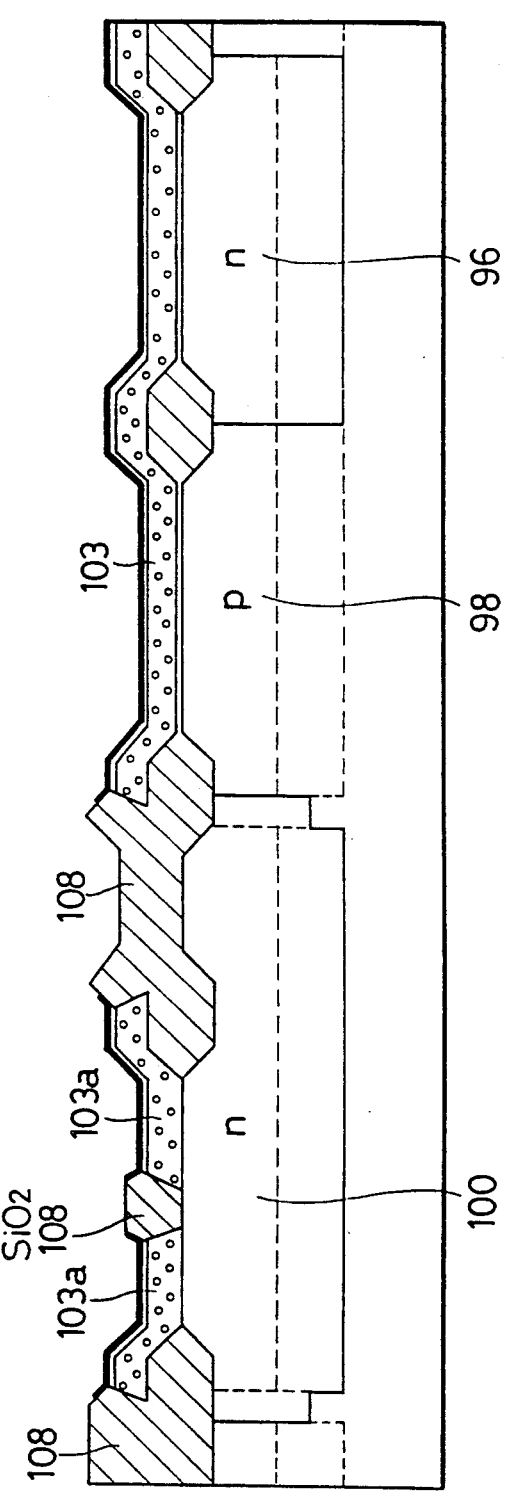

Next, with reference to FIG. 2D, the polysilicon layer 103 is oxidized under high pressure (substantially seven atmospheres) at a temperature of 1030° C. for substantially 30 minutes, using the nitride layers 106 and 107 as a mask. This produces an oxide layer 108 substantially 8000 angstroms thick in central parts of the bipolar transistor base-and-emitter regions and in the collector regions and peripheral regions, but not in the MOS transistor regions 96 and 98.

Figure 2E:
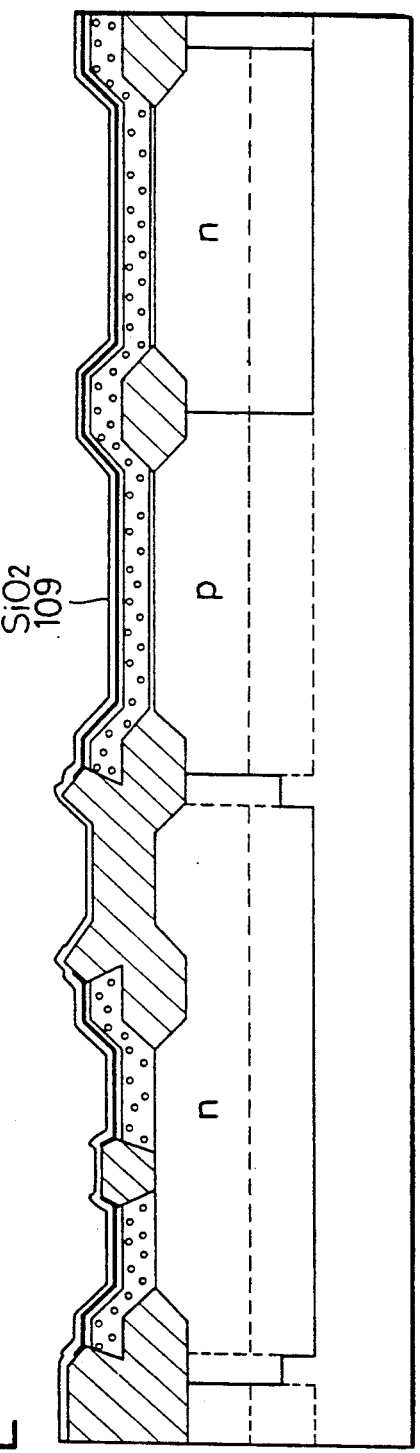

Next, with reference to FIG. 2E, an oxide layer 109 with a thickness of 500 angstroms is formed on the entire surface by the LPCVD method.

Figure 2F:
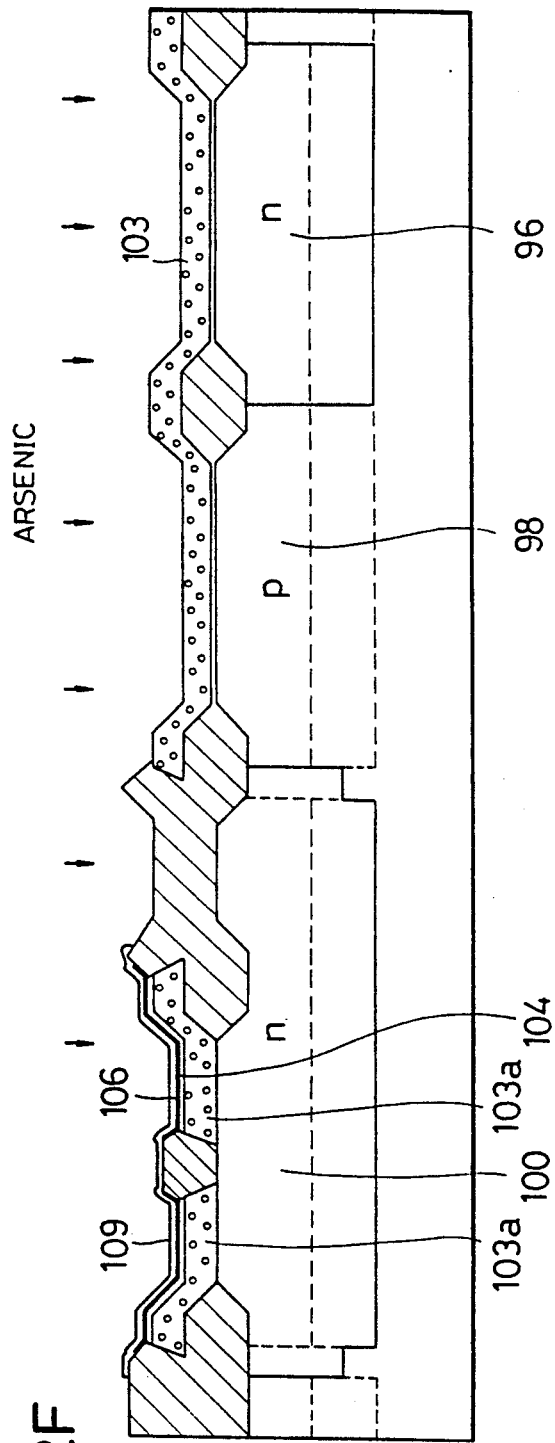

Next, with reference to FIG. 2F, the oxide layer 109, nitride layer 106, and oxide layer 104 are left intact in the bipolar transistor base-and-emitter regions 100, while the oxide layer 109, nitride layer 107, and oxide layer 104 are removed from all other regions by photolithographic etching techniques. Then arsenic ions are implanted at a dose of $1 \times 10^{16}$ cm$^{-2}$ and accelerating voltage of 40 keV into the polysilicon layers 103 over the MOS transistor regions 96 and 98. No arsenic is introduced into the polysilicon patterns 103a in the bipolar transistor base-and-emitter regions 100 at this time, due to the presence of the oxide layers 109 and 104.

Next, with reference to FIG. 2G, a tungsten silicide layer 110 with a thickness of 1500 angstroms is created on the entire surface.

Next, with reference to FIG. 2H, the tungsten silicide layer 110 and the polysilicon 103 left on the MOS transistor regions 98 and 96 are continuously patterned by photolithographic etching techniques to create gate electrodes 111 comprising the remaining parts of these two layers on the NMOS transistor regions 98 and the PMOS transistor regions 96.

Figure 2I:
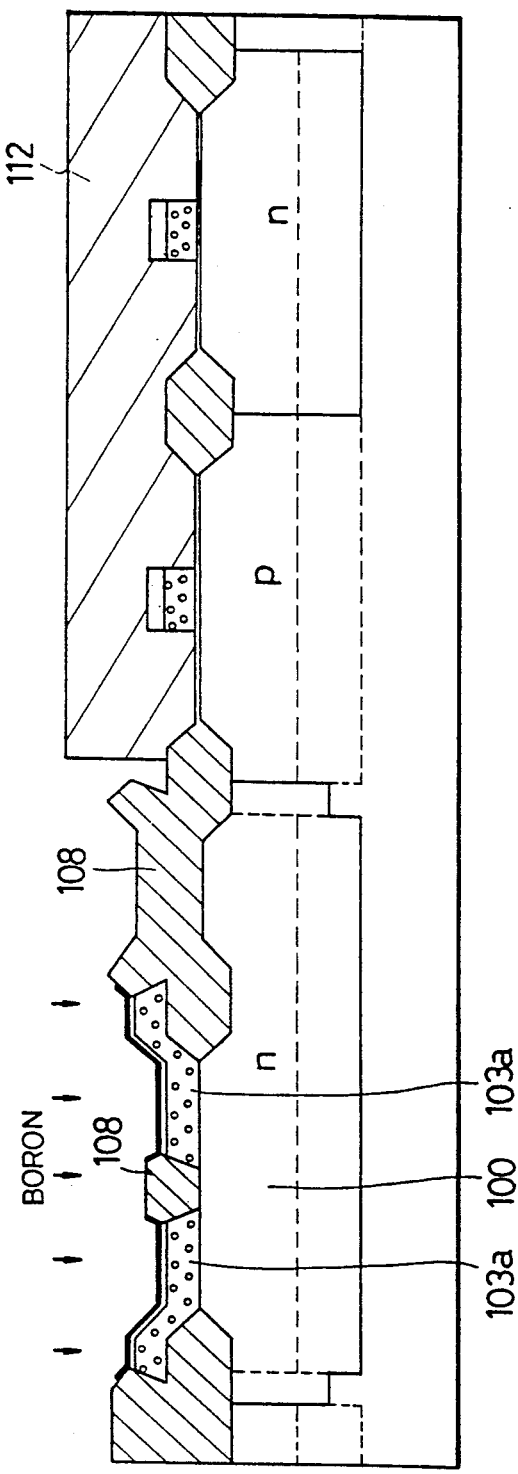

Next, with reference to FIG. 2I, the MOS transistor regions 96 and 98 are masked by a resist 112 and the oxide layer 109 is etched away from over the bipolar transistor base-and-emitter regions 100. Then boron ions are implanted into the polysilicon patterns 103a over the bipolar transistor base-and-emitter regions 100 at a dose of $2 \times 10^{15}$ cm$^{-2}$ and accelerating voltage of 100 keV.

Figure 2J:
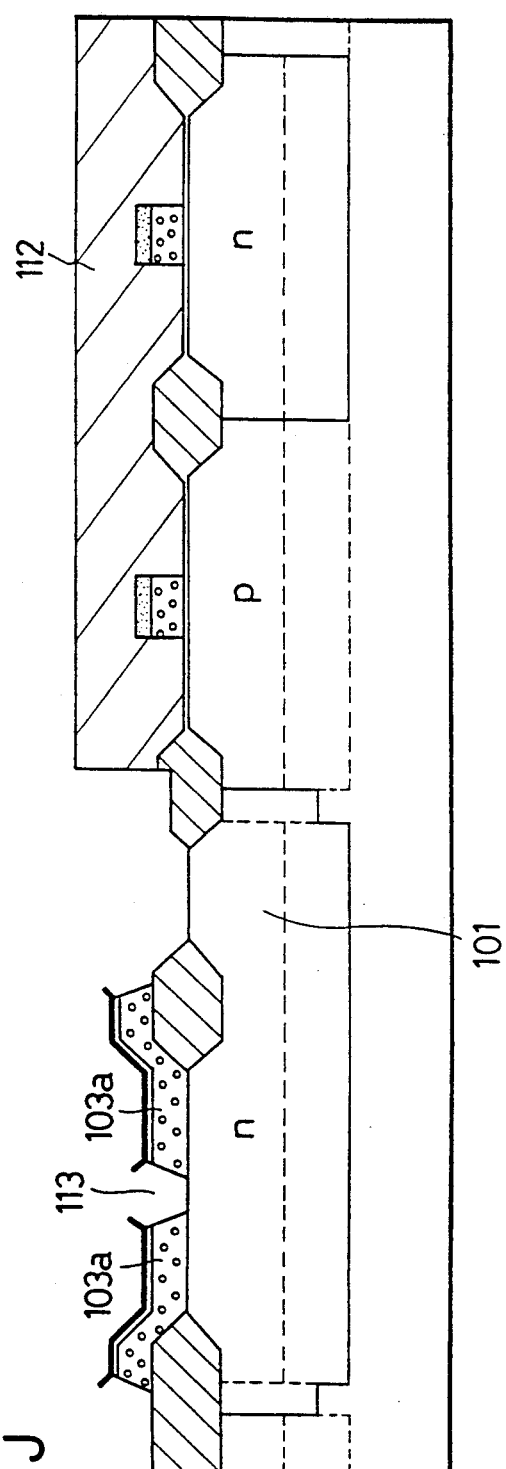

Next, with reference to FIG. 2J, the exposed oxide is etched to a depth of 9000 angstroms by wet etching, using the resist 112 as a mask. This etch entirely removes the oxide layer 108 that was created earlier from portions of the polysilicon layer 103, leaving central openings 113 surrounded by the polysilicon patterns 103a, and exposing the surface of the bipolar transistor collector regions 101. The resist 112 is now removed.

Next, with reference to FIG. 2K, oxidation is performed at 800° C. for substantially 20 minutes to form an oxide layer 114 with a thickness of 180 angstroms on the inner surface of the openings 113, the outside surfaces of the polysilicon patterns 103a, the surfaces of the collector regions 101, and the upper and lateral surfaces of the gate electrodes 111. Then boron ions are implanted at a dose of $1.5 \times 10^{13}$ cm$^{-2}$ and accelerating voltage of 10 keV through the central openings 113 into the base-and-emitter regions 100, other regions being masked at this time by a resist not shown in the drawing.

The wafer is now annealed at 800° C. for substantially 30 minutes to activate the boron just implanted and create an active base 115 having a sheet resistance of 1.5k $\Omega$/square and diffusion depth of 0.15 $\mu$m in the base-and-emitter region 100 of each bipolar transistor. The annealing also causes the boron implanted in FIG. 2I to diffuse from the polysilicon patterns 103a into the base-and-emitter regions 100, forming an extrinsic base 116 with a sheet resistance of 200 $\Omega$/square and diffusion depth of 0.2 $\mu$m.

Next, with reference to FIG. 2L, boron ions are selectively implanted at a dose of $1.0 \times 10^{13}$ cm$^{-2}$ and accelerating voltage of 30 keV into the PMOS transistor regions 96 with the gate electrodes 111 as masks, forming p$^-$-lightly-doped source and drain layers 117 similar to the p$^-$-lightly-doped source and drain layers 65 in FIG. 1H.

Figure 2M:
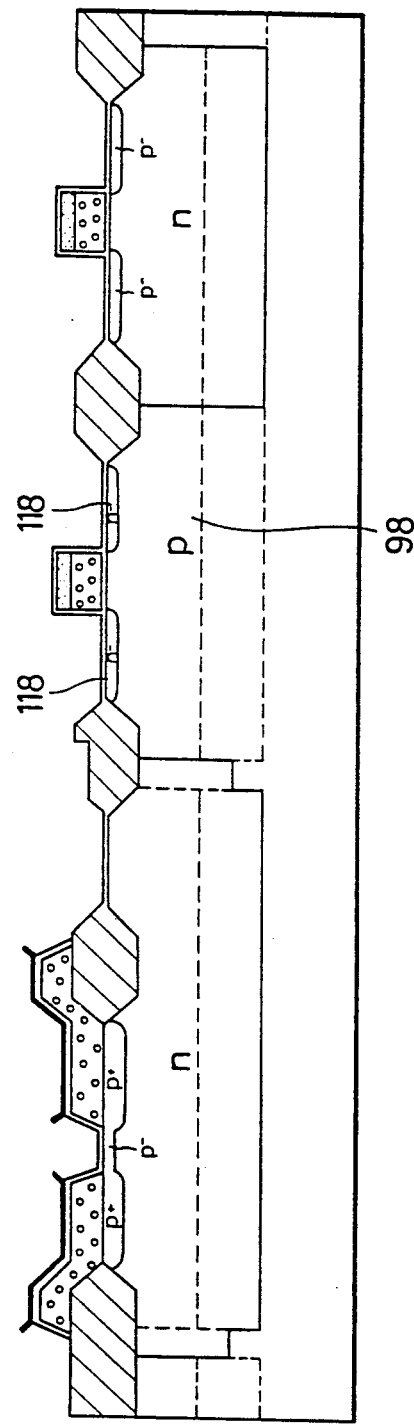

Next, with reference to FIG. 2M, phosphorus ions are selectively implanted at a dose of $1.5 \times 10^{13}$ cm$^{-2}$ and accelerating voltage of 30 keV into the NMOS transistor regions 98 with the gate electrodes 111 as masks, forming n$^-$-lightly-doped source and drain layers 118 similar to the n$^-$-lightly-doped source and drain layers 66 in FIG. 1I.

Figure 2N:
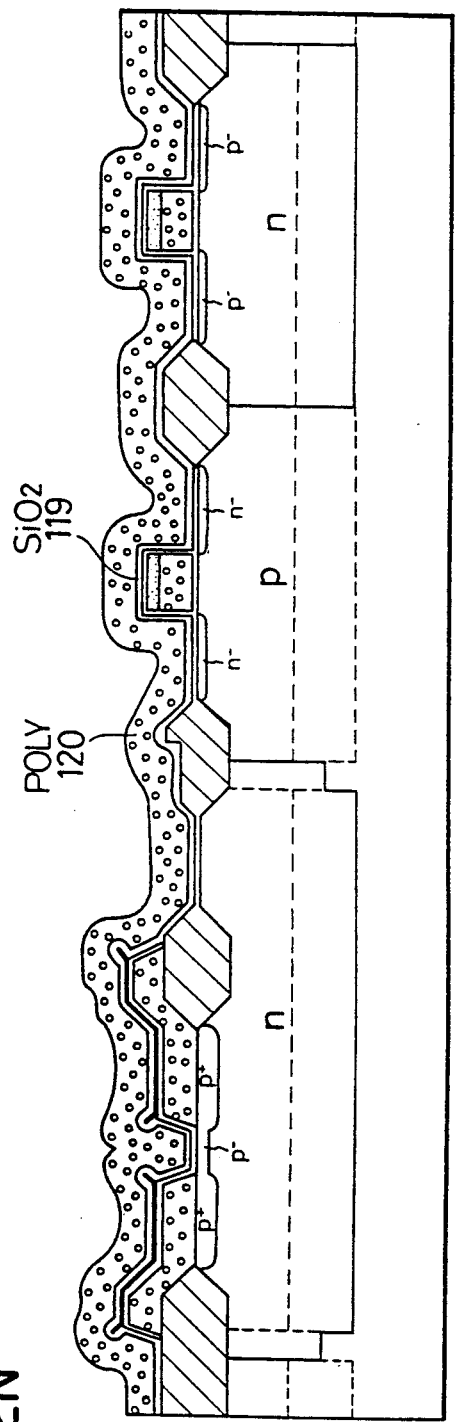

Next, with reference to FIG. 2N, an oxide layer 119 with a thickness of 1000 angstroms is formed on the entire surface of the substrate by the LPCVD method. Then a polysilicon layer 120 with a thickness of 2000 angstroms is formed on the entire surface.

Figure 2O:
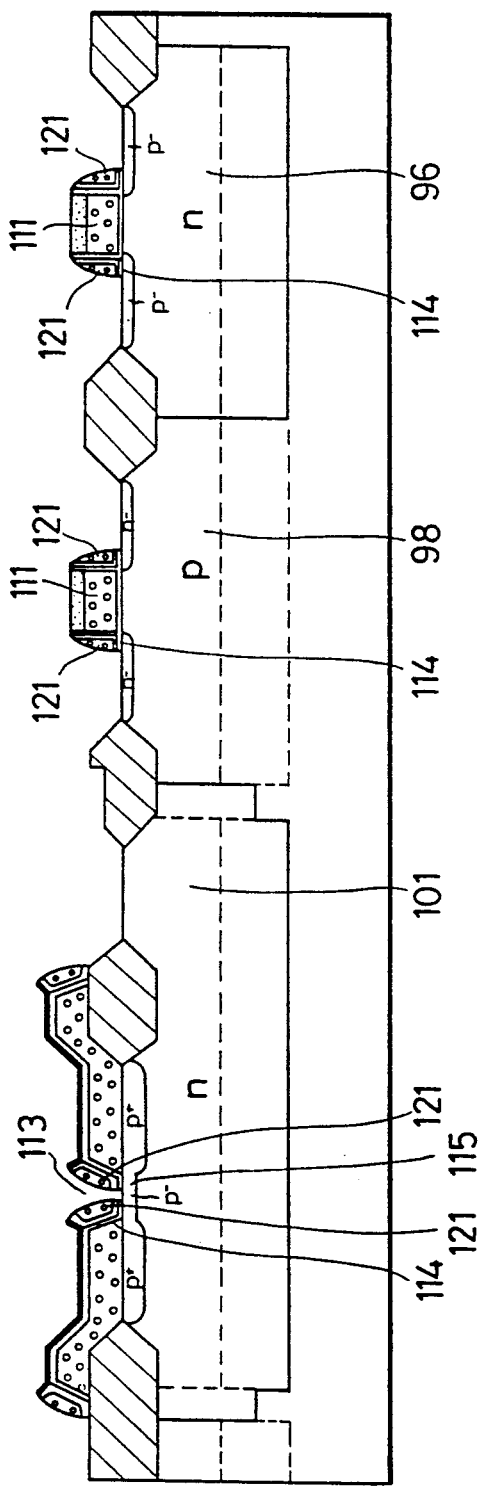

Next, with reference to FIG. 2O, an anisotropic reactive ion etch is performed to remove all of the polysilicon layer 120 and the oxide layer 119 except for sidewalls 121, which are formed in particular on the lateral walls of the central openings 113 and the gate electrodes 111. As in FIG. 1L, the sidewalls 121 narrow the central openings 113 to less than the design rule, and establish a 0.2 $\mu$m offset zone on both sides of the gate electrodes 111 of the NMOS and PMOS transistors.

This reactive ion etch also etches the oxide layers 114, exposing the surface of the active base regions 115 at the bottom of the central openings 113, the surfaces of the collector regions 101, the upper surfaces of the gate electrodes 111, and the surfaces of the source and drain regions of the MOS transistor regions 96 and 98.

Figure 2P:
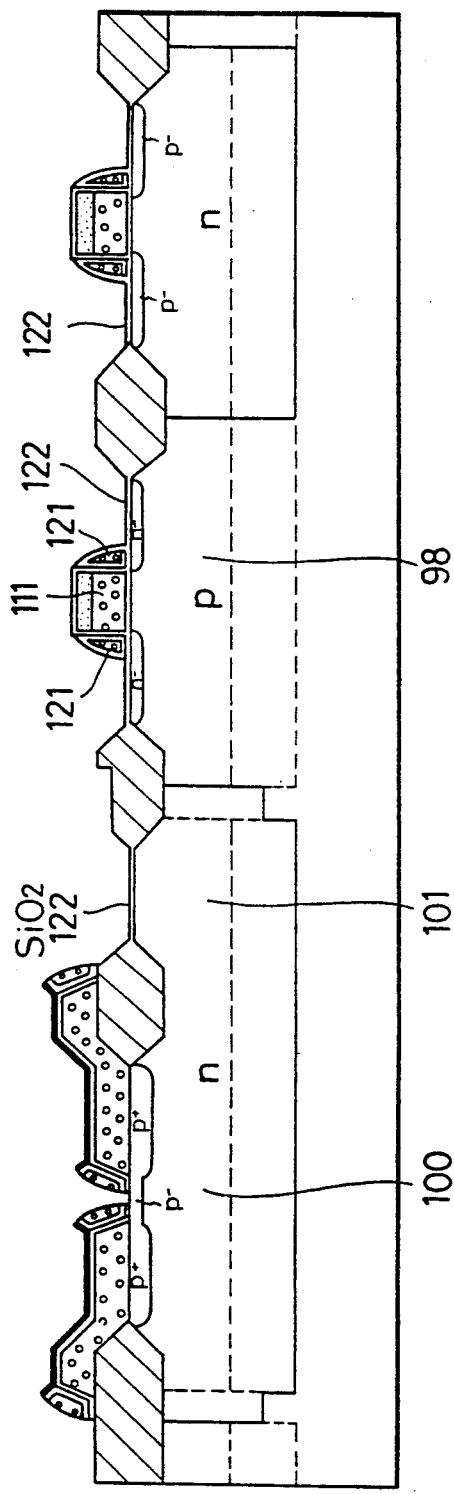

Next, with reference to FIG. 2P, an oxide layer 122 with a thickness of 200 angstroms is formed on these exposed surfaces and the lateral surfaces of the sidewalls 121 by oxidation at 900° C. for substantially 30 minutes. The oxide layer is then selectively removed from the base-and-emitter regions 100 by photolithographic etching.

Next, with reference to FIG. 2Q, arsenic ions are selectively implanted at a dose of $5 \times 10^{15}$ cm$^{-2}$ and accelerating voltage of 40 keV into the NMOS transistor regions 98 and the bipolar transistor collector regions 100, using a patterned resist not shown in the drawing, the gate electrodes 111 and sidewalls 121 also serving as a mask. This creates n+layers that form the collector regions 123 of the bipolar transistors, and the n+heavily-doped source and drain layers 124 of the NMOS transistors, completing the LDD structure of the NMOS transistors.

Next, with reference to FIG. 2R, a polysilicon layer 125 with a thickness of 3000 angstroms is formed overall by the LPCVD method, and its surface is oxidized at 800° C. for substantially 20 minutes to form an oxide layer 126 with a thickness of 160 angstroms. Then arsenic ions are implanted at a dose of $1.0 \times 10^{16}$ cm$^{-2}$ and an accelerating voltage of 40 keV through the oxide layer 126 into the polysilicon layer 125.

Figure 2S:
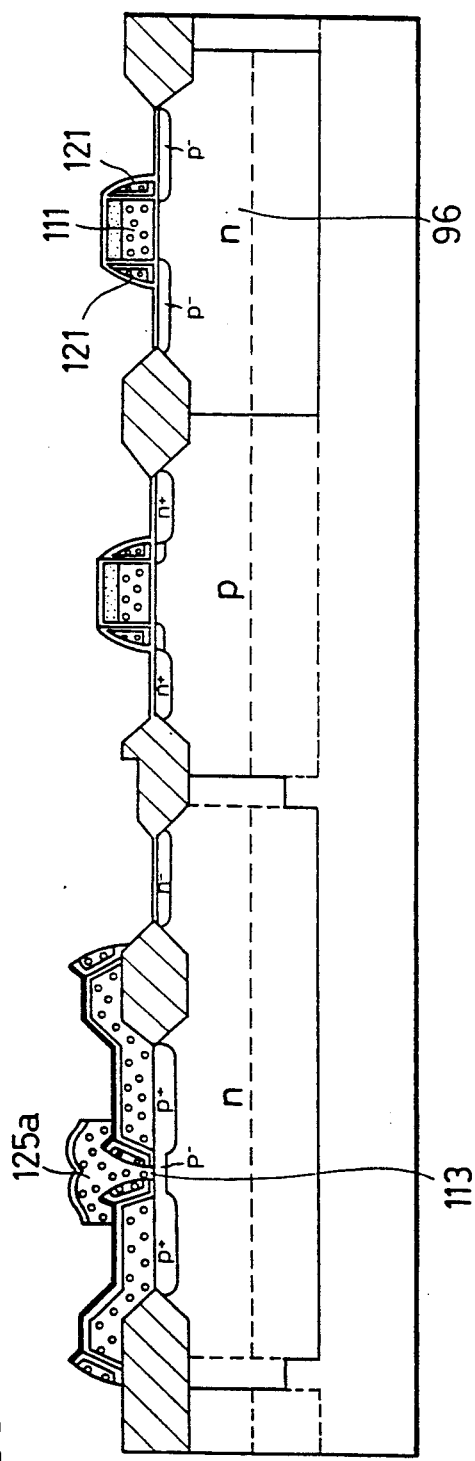

Next, with reference to FIG. 2S, the oxide layer 126 and polysilicon layer 125 are patterned by photolithographic etching techniques to form emitter electrodes 125a comprising the remaining polysilicon layer 125 in the openings 113.

Figure 2T:
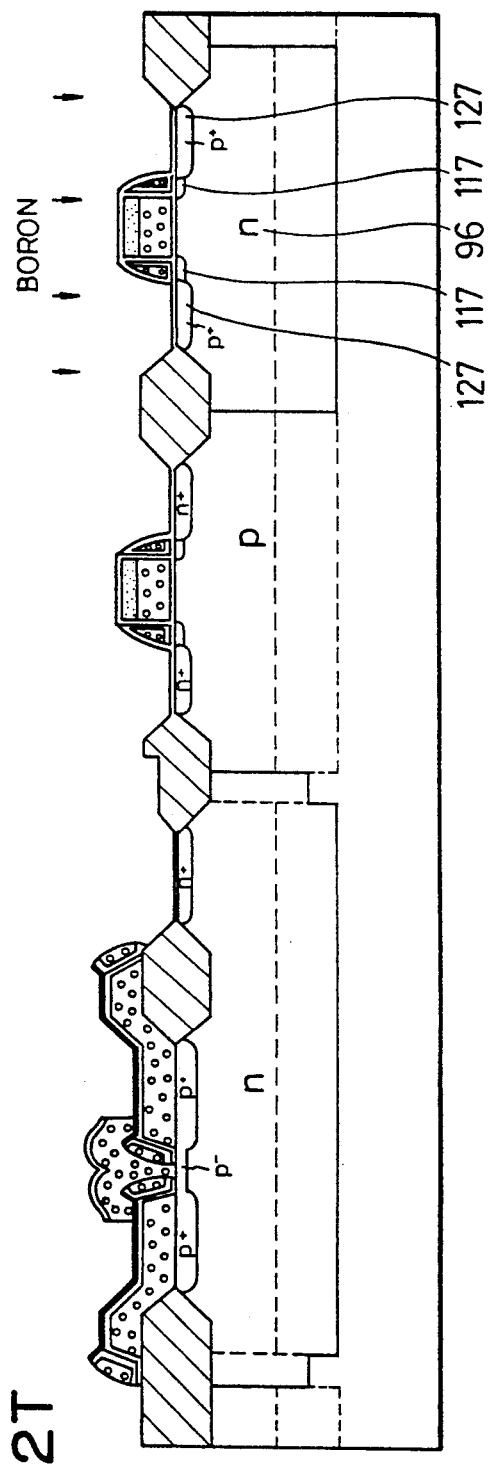

Next, with reference to FIG. 2T, boron ions are selectively implanted at a dose of $2 \times 10^{15}$ cm$^{-2}$ and accelerating voltage of 40 keV into the PMOS transistor regions 96, using the gate electrodes 111 and sidewalls 121 as a mask, to form p+heavily-doped source and drain layers 127. This completes the LDD structure of the PMOS transistors.

Figure 2U:
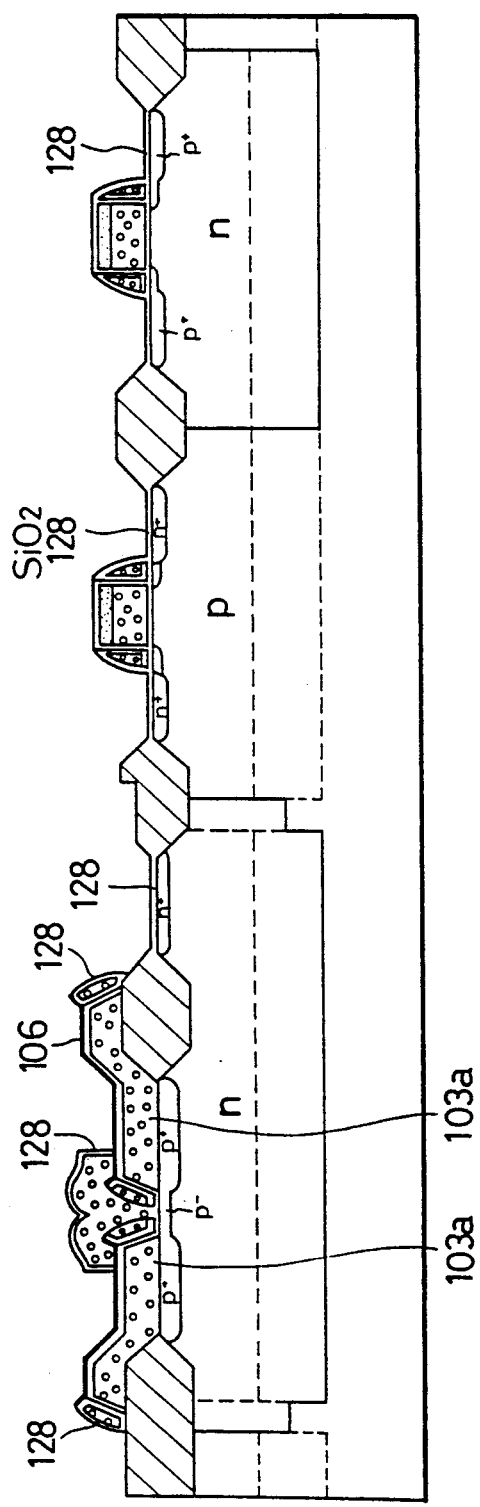

Next, with reference to FIG. 2U, oxidation is performed at 800° C. for substantially 20 minutes to form an oxide layer 128 with a thickness of 900 angstroms on the entire surface of the wafer, except where it is covered by the nitride layer 106.

Figure 2V:
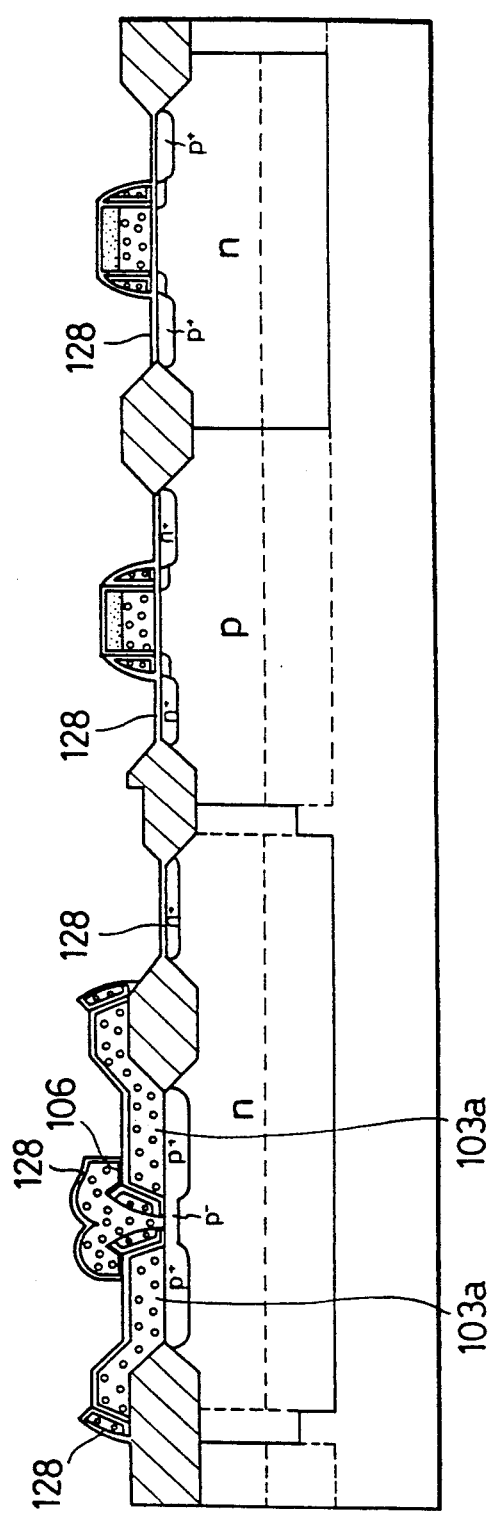

Next, with reference to FIG. 2V, the exposed portions of the nitride layers 106 are removed by etching with phosphoric acid, using the oxide layer 128 as a mask.

Next, with reference to FIG. 2W, a 7000-angstrom layer of BPSG 129 is formed over the entire surface by the CVD method, using 20 wt. % $P_2O_5$ and 8 wt. % $B_2O_3$, and the wafer is annealed at 920° C. for substantially 30 minutes. This annealing process planarizes the BPSG layer 129 and causes arsenic to diffuse from the emitter electrodes 125a into the active bases 115, forming emitters 130 therein with a sheet resistance of 20 Ω/square and diffusion depth of 0.1 μm.

Finally, contact holes are opened over the gate and emitter electrodes and over the source, drain, and collector regions, and a metalization process is carried out to interconnect the transistors into the desired circuits. These final steps are not illustrated in the drawings.

Both novel fabrication methods described above fabricate bipolar transistors having an emitter width less than the design rule, resulting in a high cut-off frequency $f_T$, and MOS transistors with an LDD structure, resulting in high reliability. Experiments carried out by the inventors have demonstrated $f_T = 12$ GHz in bipolar transistors with an emitter area of $0.6 \times 3$ μm$^2$, and lifetimes of $\tau = 1 \times 10^5$ seconds for NMOS transistors with gate lengths of 1.4 μm and gate widths of 20 μm. The quantity $\tau$ is the expected time for a 10% variation in $g_m$ at $V_{DS} = 8$ V, $V_{GS} = 4$ V.

Figure 3:
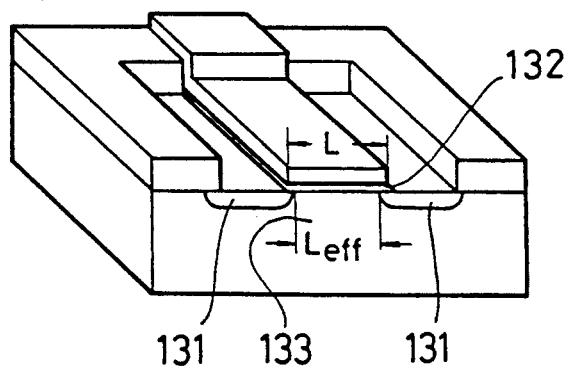
FIG. 3 is an oblique view illustrating the structure of a MOS transistor fabricated by prior-art methods.

The improved MOS transistor lifetime $\tau$ can be explained as follows. FIG. 3 shows the structure of a MOS transistor fabricated by prior-art methods, in which heavily-doped source and drain layers 131 extend all the way to the gate oxide 132 and even slightly thereunder. The effective length $L_{eff}$ of the channel 133 is thus less than the gate length L.

When the transistor operates in the triode region, the electric field in the depletion layer at the bottom of the channel 133 is given by the formula:

$$\epsilon = V_{DS}/L_{eff}$$

where $V_{DS}$ is the voltage between source and drain. A short gate length, resulting in a small $L_{eff}$, tends to increase the electric field and produce hot carriers. When the transistor operates in the saturation region, the electric field becomes highly concentrated in the depletion layer near the drain, as shown in FIG. 4, reaching a maximum value much higher than the value given by the preceding formula, thus causing even more production of hot carriers.

Figure 4:
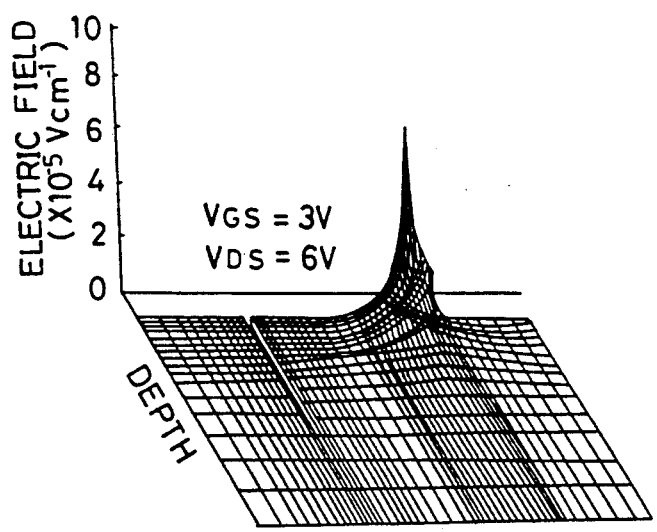
FIG. 4 is a graph illustrating simulated electric field intensity in the transistor in FIG. 3.
Figure 5:
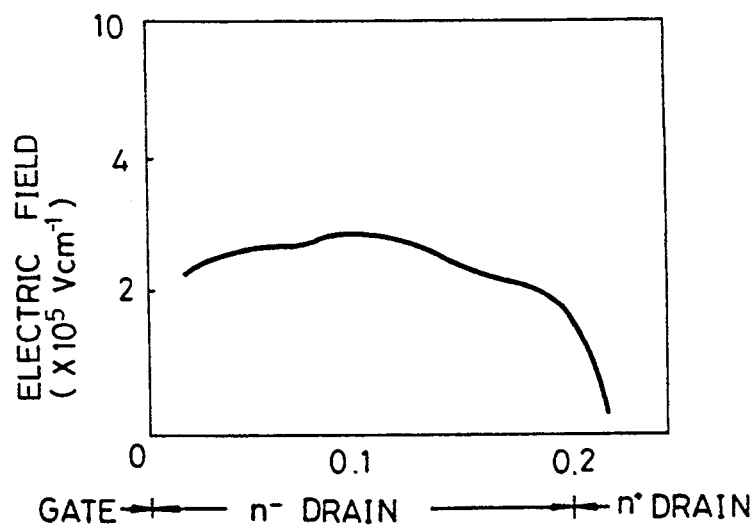
FIG. 5 is a graph illustrating simulated electric field intensity in an NMOS transistor fabricated by the novel method.

When the transistor has an LDD structure as in the present invention, however, the electric field does not peak near the drain as in FIG. 4. FIG. 5 shows the result of a simulation of the electrical field strength in the vicinity of the drain of an NMOS transistor fabricated by the novel method. The electric field rises only slightly in the n− lightly-doped layer, not reaching the excessive values shown in FIG. 4. Accordingly, the novel method has significantly less tendency than the prior art to produce hot carriers.

Another advantage of the novel method is that the same fabrication step forms both the sidewalls that narrow the emitters of the bipolar transistors and the sidewalls that create offset zones around the gate electrodes of the MOS transistors. That is, the same step improves the speed performance of the bipolar transistors and the reliability of the MOS transistors.

Another feature of the novel method is that since the oxidation step illustrated in FIGS. 1D and 2D is performed under high pressure, it can be performed at a comparatively low temperature. Oxide can thus be formed without altering the diffusion profiles of the underlying layers. A further advantage of high-pressure oxidation is that the resulting oxide/polysilicon interface has a sharper taper than when oxidation is performed at standard atmospheric pressure. This results in a larger cross-sectional area for the gate electrodes, when the gate electrodes are defined by this oxidation step as in FIG. 1D.

Various modifications, which will be obvious to one skilled in the art, can be made in the two novel fabrication methods described above without departing from the spirit and scope of the invention. For example, the order of the two steps shown in FIGS. 1H and 1I can obviously be reversed. The order of the steps in FIGS. 2Q and 2V can also be altered in various ways.

What is claimed is:

1. A biMOS fabrication method, comprising steps of:
   (a) dividing a semiconductor substrate into mutually isolasted bipolar transistor regions and MOS transistor regions, subdividing said bipolar transistor regions into mutually isolated base-and-emitter regions and collector regions, covering said MOS transistor regions wiht a first oxide layer, then covering all regions with a first polysilicon layer;

(b) covering said first polysilicon layer with a nitride layer in central parts of said MOS transistor regions, and in non-central parts of said base-and-emitter regions, then oxidizing all portions of said first polysilicon layer not covered by said nitride layer;

(c) implanting ions through said nitride layer and said first polysilicon layer in said base-and-emitter regions, thereby forming extrinsic bases in said base-and-emitter regions;

(d) removing all oxidized portions of said first polysilicon layer, thereby leaving polysilicon patterns surrounding central openings in said base-and-emitter regions, and leaving polysilicon gate electrodes in said MOS transistor regions;

(e) implanting ions through said central openings, thereby creating active bases in said base-and-emitter regions, and implanting ions into said MOS transistor regions with said gate electrodes as masks, thereby creating lightly-doped source and drain layers;

(f) covering all regions with a second oxide layer and a second polysilicon layer and anisotropically etching said second oxide layer and said second polysilicon layer, thereby forming sidewalls comprising remaining parts of said second oxide layer and said second polysilicon layer on lateral walls of said central openings and lateral walls of said gate electrodes;

(g) covering all regions with a third polysilicon layer, doping said third polysilicon layer with impurities, and patterning said third polysilicon layer to create emitter electrodes in said central openings within said sidewalls, and source and drain electrodes adjacent to said sidewalls on respective sides of said gate electrodes in said MOS transistor regions; and (h) annealing said substrate, thereby diffusing said impurities from said emitter electrodes into said active bases to create emitters therein, and from said source and drain electrodes into said MOS transistor regions to create heavily-doped source and drain layers.

2. The method of claim 1, wherein the oxidizing in step (b) is performed under a pressure of substantially seven atmospheres.

3. A biMOS fabrication method, comprising steps of:
(a) dividing a semiconductor substrate into mutually isolated bipolar transistor regions and MOS transistor regions, subdividing said bipolar transistor regions into mutually isolated base-and-emitter regions and collector regions, covering said MOS transistor regions with a first oxide layer, then covering all regions with a first polysilicon layer;

(b) covering said first polysilicon layer with a nitride layer in said MOS transistor regions, and in non-central parts of said base-and-emitter regions, then oxidizing all portions of said first polysilicon layer not covered by said nitride layer;

(c) removing said nitride layer from said MOS transistor regions, forming a refractive-metal-silicide layer on said first polysilicon layer, and patterning said first polysilicon layer and said refractive-metal-silicide layer in said MOS transistor regions to form gate electrodes centrally located therein;

(d) doping said first polysilicon layer in said base-and-emitter regions with impurities;

(e) removing all oxidized portions of said first polysilicon layer, thus leaving polysilicon patterns surrounding central openings in said base-and-emitter regions;

(f) implanting ions through said central openings and annealing said substrate, thus creating active bases below said central openings, also causing impurities to diffuse from said polysilicon patterns and create extrinsic bases therebelow;

(g) doping said MOS transistor regions with said gate electrodes as masks, thereby forming lightly-doped source and drain layers;

(h) covering all regions with a second oxide layer and a second polysilicon layer and anisotropically etching said second oxide layer and said second polysilicon layer, thereby forming sidewalls comprising remaining parts of said second oxide layer and said second polysilicon layer on lateral walls of said central openings and lateral walls of said gate electrodes; and (i) forming emitter electrodes comprising polysilicon doped with impurities in said central openings within said sidewalls, diffusing said impurities from said emitter electrodes into said active bases, thus forming emitters therein, and implanting ions into said MOS transistor regions, using said gate electrodes and said sidewalls as masks, thus forming heavily-doped source and drain layers.

4. The method of claim 3, wherein the oxidizing in step (b) is performed at a pressure of substantially seven atmospheres.

5. A biCMOS fabrication method, comprising steps of:
(a) dividing a monocrystalline silicon substrate into mutually isolated bipolar transistor regions doped with n-type impurities, NMOS transistor regions doped with p-type impurities, and PMOS transistor regions doped with n-type impurities, subdividing said bipolar transistor regions into mutually isolated base-and-emitter regions and collector regions, covering all regions with a first oxide layer, and covering said first oxide layer with a first nitride layer;

(b) removing said first oxide layer and said first nitride layer from said base-and-emitter regions, then covering all regions with a first polysilicon layer;

(c) covering said first polysilicon layer with a second nitride layer in central parts of said MOS transistor regions, and in non-central parts of said base-and-emitter regions;

(d) oxidizing all portions of said first polysilicon layer not covered by said second nitride layer;

(e) implanting boron through said second nitride layer and said first polysilicon layer in said base-and-emitter regions, thereby forming extrinsic bases in said base-and-emitter regions;

(f) removing all oxidized portions of said first polysilicon layer, thereby leaving polysilicon patterns surrounding central openings in said base-and-emitter openings, and leaving polysilicon gate electrodes in said NMOS transistor regions and said PMOS transistor regions;

(g) removing exposed portions of said first nitride layer, oxidizing exposed lateral walls of said polysilicon gate electrodes, and oxidizing all surfaces of said central openings;

(h) implanting boron through said central openings, thereby creating active bases in said base-and-emitter regions, and through said first oxide layer in said PMOS transistor regions, using said gate electrodes as masks, thereby creating lightly-doped source and drain layers in said PMOS transistor regions;

(i) implanting phosphorus through said first oxide layer in said NMOS transistor regions, using said gate electrodes as masks, thereby creating lightly-doped source and drain layers in said NMOS transistor regions;

(j) covering all regions with a second oxide layer formed by low-pressure chemical vapor deposition;

(k) covering said second oxide layer with a second polysilicon layer formed by low-pressure chemical vapor deposition;

(l) anisotropically etching said second oxide layer and said second polysilicon layer, thereby forming sidewalls comprising remaining parts of said second oxide layer and said second polysilicon layer on lateral walls of said central openings and lateral walls of said gate electrodes;

(m) covering all regions with a third polysilicon layer, and oxidizing the surface thereof;

(n) implanting arsenic into said third polysilicon layer over said bipolar transistor regions and said NMOS transistor regions, and implanting boron into said third polysilicon layer over said PMOS transistor regions;

(o) patterning said third polysilicon layer to create emitter electrodes in said central openings within said sidewalls, and source and drain electrodes adjacent to said sidewalls on respective sides of said gate electrodes in said NMOS transistor regions and said PMOS transistor regions;

(p) oxidizing exposed lateral surfaces of said third polysilicon layer;

(q) removing exposed portions of said second nitride layer; and (r) covering all regions with a layer of borophosphosilicate glass and annealing said substrate, thereby diffusing arsenic from said emitter electrodes into said active bases to create emitters therein, diffusing arsenic from said source and drain electrodes into said NMOS transistor regions to create heavily-doped source and drain layers therein, and diffusing boron from said source and drain electrodes into said PMOS transistor regions to create heavily-doped source and drain layers therein.

6. The method of claim 5, wherein step (d) is performed at a pressure of substantially seven atmospheres.

7. A biCMOS fabrication method, comprising steps of:

(a) dividing a monocrystalline silicon substrate into mutually isolated bipolar transistor regions doped with n-type impurities, NMOS transistor regions doped with p-type impurities, and PMOS transistor regions doped with n-type impurities, subdividing said bipolar transistor regions into mutually isolated base-and-emitter regions and collector regions, and covering all regions with a first oxide layer;

(b) removing said first oxide layer from said bipolar transistor regions, then covering all regions with a first polysilicon layer;

(c) oxidizing a surface layer of said first polysilicon layer to form a second oxide layer, covering said second oxide layer with a nitride layer, and removing said nitride layer from said collector regions and from central portions of said base-and-emitter regions;

(d) oxidizing said first polysilicon layer where not covered by said nitride layer, thus leaving polysilicon patterns in non-central portions of said base-and-emitter regions;

(e) forming a third oxide layer by low-pressure chemical vapor deposition on said nitride layer and oxidized portions of said first polysilicon layer;

(f) removing said third oxide layer, said nitride layer, and said second oxide layer from said collector regions, said NMOS transistor regions, and said PMOS transistor regions, and implanting arsenic into exposed portions of said first polysilicon layer;

(g) forming a tungsten-silicide layer contacting said first polysilicon layer in said NMOS transistor regions and said PMOS transistor regions;

(h) patterning said tungsten-silicide layer and said first polysilicon layer in said NMOS transistor regions and said PMOS transistor regions to form centrally located gate electrodes, comprising remaining portions of said tungsten-silicide layer and said first polysilicon layers;

(i) removing said third oxide layer from said base-and-emitter regions, and implanting boron into said polysilicon patterns in said base-and-emitter regions;

(j) removing oxidized portions of said first polysilicon layer from said bipolar transistor regions, thus leaving central openings surrounded by said polysilicon patterns in said base-and-emitter regions;

(k) oxidizing all exposed surfaces not covered by said nitride layer, then implanting boron through said central openings and annealing said substrate, thus creating active bases below said central openings, also causing said boron to diffuse from said polysilicon patterns and form extrinsic bases therebelow;

(l) implanting boron into said PMOS transistor regions, using said gate electrodes as masks, thereby forming lightly-doped source and drain layers;

(m) implanting phosphorus into said NMOS transistor regions, using said gate electrodes as masks, thereby forming lightly-doped source and drain layers;

(n) covering all regions with a fourth oxide layer formed by low-pressure chemical vapor deposition, and covering said fourth oxide layer with a second polysilicon layer formed by low-pressure chemical vapor deposition;

(o) anisotropically etching said fourth oxide layer and said second polysilicon layer, thereby forming sidewalls comprising remaining parts of said fourth oxide layer and said second polysilicon layer on lateral walls of said central openings and lateral walls of said gate electrodes;

(p) forming a fifth oxide layer on exposed surfaces in said collector regions, said NMOS transistor regions, and said PMOS transistor regions;

(q) implanting arsenic into said collector regions and said NMOS transistor regions, using said gate electrodes and said sidewalls as masks, thereby forming collectors in said collector regions and heavily-doped source and drain layers in said NMOS transistors regions;

(r) forming a third polysilicon layer over all regions, oxidizing the surface thereof, and implanting arsenic into said third polysilicon layer;

(s) patterning said third polysilicon layer to form emitter electrodes filling said central openings within said sidewalls;

(t) implanting boron into said PMOS transistor regions, using said gate electrodes and said sidewalls as masks, thereby forming heavily-doped source and drain layers;

(u) oxidizing all exposed surfaces not covered by said nitride layer;

(v) removing all exposed parts of said nitride layers;

(w) covering all regions with a layer of borophosilicate glass and annealing said substrate, thereby diffusing arsenic from said emitter electrodes into said active bases to create emitters therein.

8. The method of claim 7, wherein step (d) is performed at a pressure of substantially seven atmospheres.

* * * * *